(12) United States Patent
Shirakawa et al.

(10) Patent No.: US 10,541,030 B2
(45) Date of Patent: Jan. 21, 2020

(54) MEMORY SYSTEM FOR RESTRAINING THRESHOLD VARIATION TO IMPROVE DATA READING

(71) Applicant: Toshiba Memory Corporation, Minato-ku (JP)

(72) Inventors: Masanobu Shirakawa, Chigasaki (JP); Marie Takada, Yokohama (JP); Tsukasa Tokutomi, Kamakura (JP); Yoshihisa Kojima, Kawasaki (JP); Kiichi Tachi, Tokyo (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/916,538

(22) Filed: Mar. 9, 2018

(65) Prior Publication Data
US 2019/0088333 A1    Mar. 21, 2019

(30) Foreign Application Priority Data

Sep. 20, 2017    (JP) .................................. 2017-180531

(51) Int. Cl.
| | |
|---|---|
| *G11C 16/04* | (2006.01) |
| *G11C 16/08* | (2006.01) |
| *G11C 16/34* | (2006.01) |
| *H01L 27/1157* | (2017.01) |
| *G11C 16/12* | (2006.01) |
| *G11C 16/26* | (2006.01) |
| *H01L 27/11582* | (2017.01) |

(52) U.S. Cl.
CPC .......... *G11C 16/08* (2013.01); *G11C 16/0483* (2013.01); *G11C 16/12* (2013.01); *G11C 16/26* (2013.01); *G11C 16/3459* (2013.01); *H01L 27/1157* (2013.01); *H01L 27/11582* (2013.01)

(58) Field of Classification Search
CPC ........................................................ G11C 8/12
USPC ..................................................... 365/185.11
See application file for complete search history.

(56) References Cited

U.S. PATENT DOCUMENTS

| | | |
|---|---|---|
| 8,250,437 B2 | 8/2012 | Sakurada et al. |
| 2009/0267128 A1 | 10/2009 | Maejima |

(Continued)

FOREIGN PATENT DOCUMENTS

| | | |
|---|---|---|
| JP | 2014-063555 | 4/2014 |
| JP | 2014-137841 | 7/2014 |

(Continued)

*Primary Examiner* — Hoai V Ho
(74) *Attorney, Agent, or Firm* — Oblon, McClelland, Maier & Neustadt, L.L.P.

(57) ABSTRACT

According to one embodiment, a memory system includes a semiconductor memory and a controller. The semiconductor memory includes: first memory cells, first word lines, a first row decoder, and a driver circuit. The first row decoder includes first transistors capable of coupling the first word lines to first signal lines, and a first block decoder supplying a first block selection signal to the first transistors. When the controller issues a data read command, the first block decoder asserts the first block selection signal to allow the first transistors to transfer a first voltage to a selected first word line, and a second voltage to unselected other first word lines. After data is read, the first block decoder continues asserting the first block selection signal, and the driver circuit transfers a third voltage.

7 Claims, 20 Drawing Sheets

(56) References Cited

U.S. PATENT DOCUMENTS

| | | |
|---|---|---|
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0069663 A1 | 3/2012 | Itagaki et al. |
| 2012/0307557 A1 | 12/2012 | Itagaki |
| 2014/0085983 A1 | 3/2014 | Hosono |
| 2014/0204684 A1* | 7/2014 | Kwak ............... G11C 7/10 365/189.05 |
| 2015/0070993 A1 | 3/2015 | Nagadomi |
| 2015/0138883 A1* | 5/2015 | Shiga ............... G11C 16/3436 365/185.05 |
| 2015/0138886 A1 | 5/2015 | Hishida et al. |
| 2016/0078959 A1 | 3/2016 | Bushnaq et al. |

FOREIGN PATENT DOCUMENTS

| | | |
|---|---|---|
| JP | 2015-056190 | 3/2015 |
| JP | 2015-097245 | 5/2015 |
| JP | 2016-058126 | 4/2016 |

\* cited by examiner

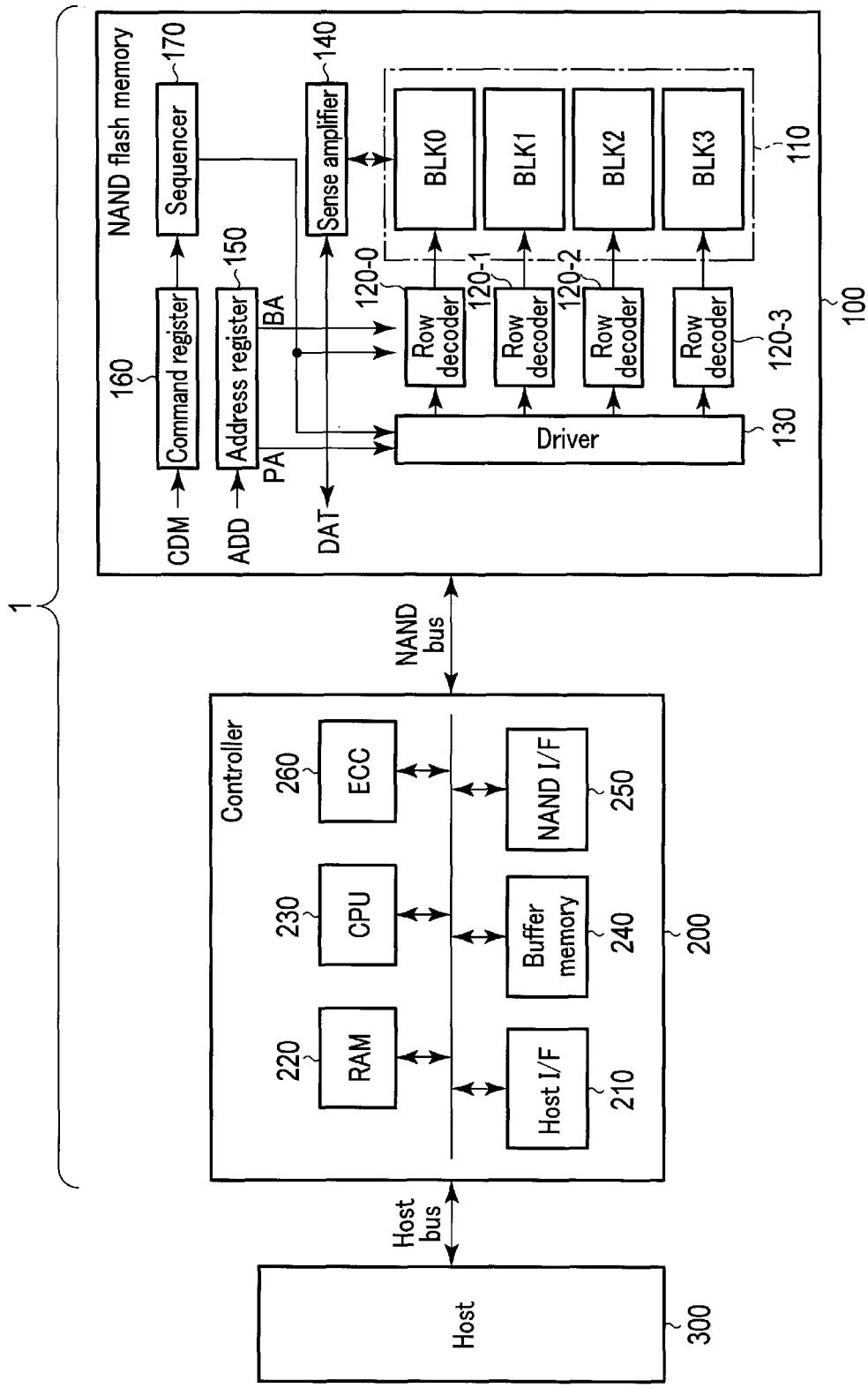
F I G. 1

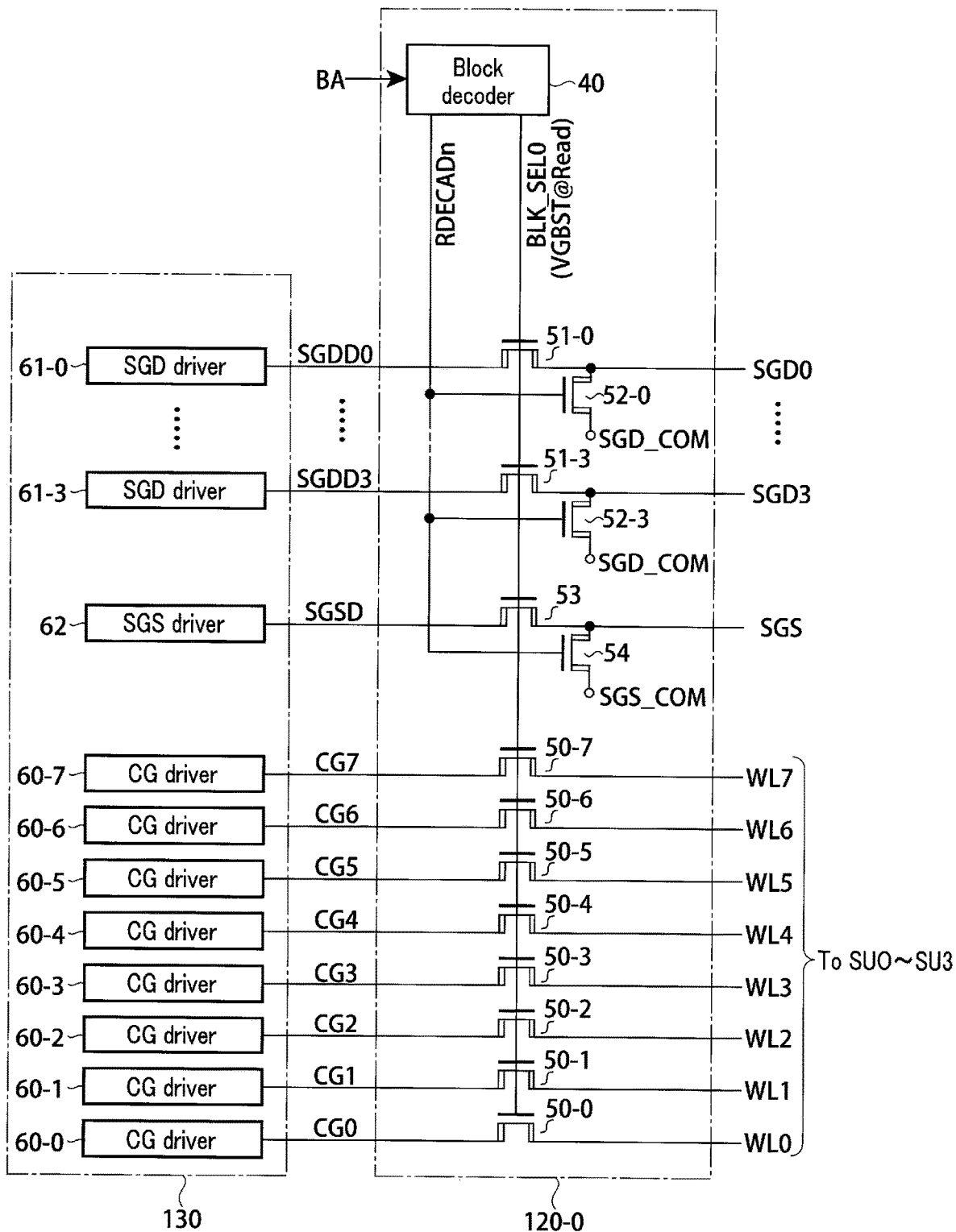
F I G. 4

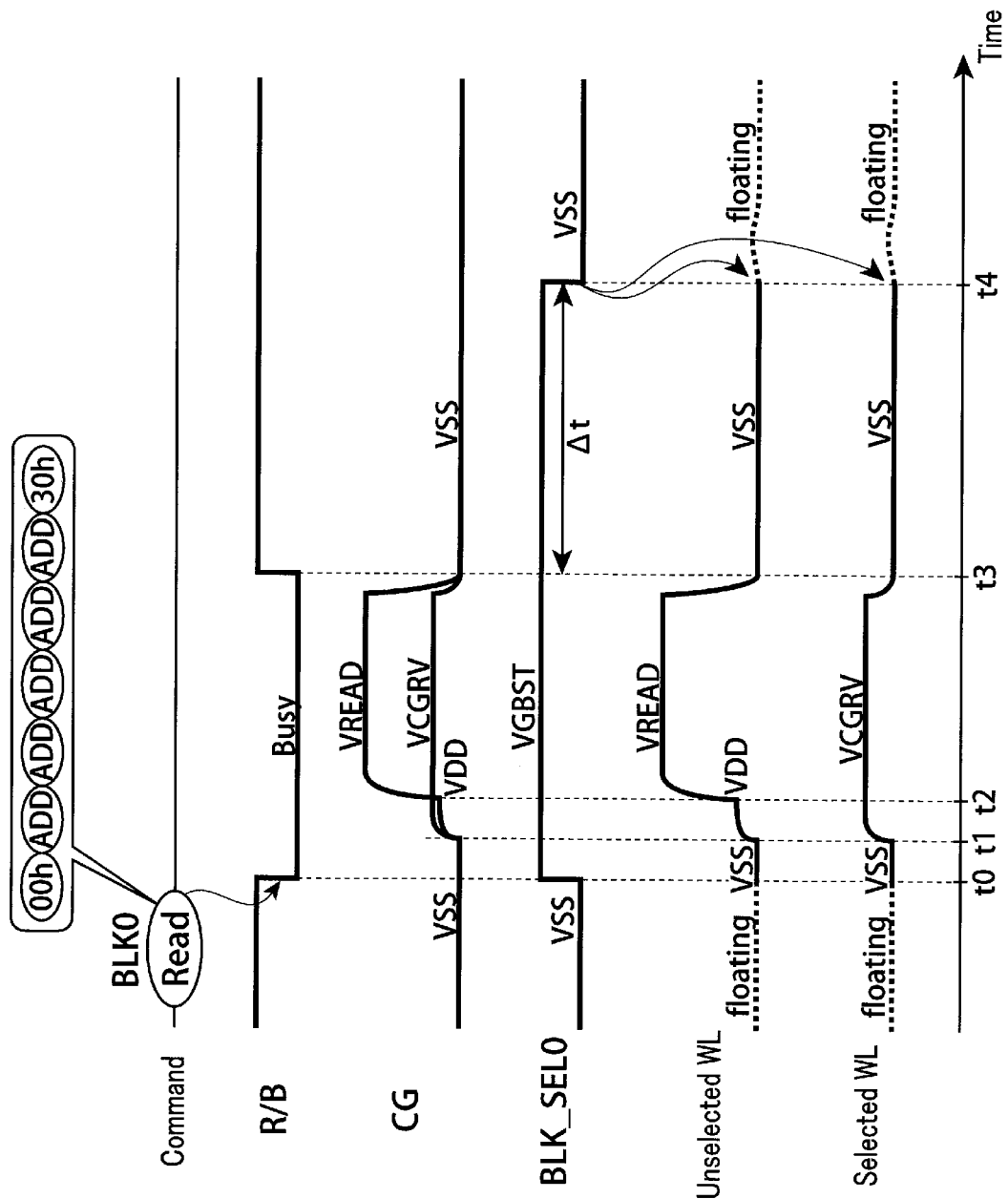
F I G. 6

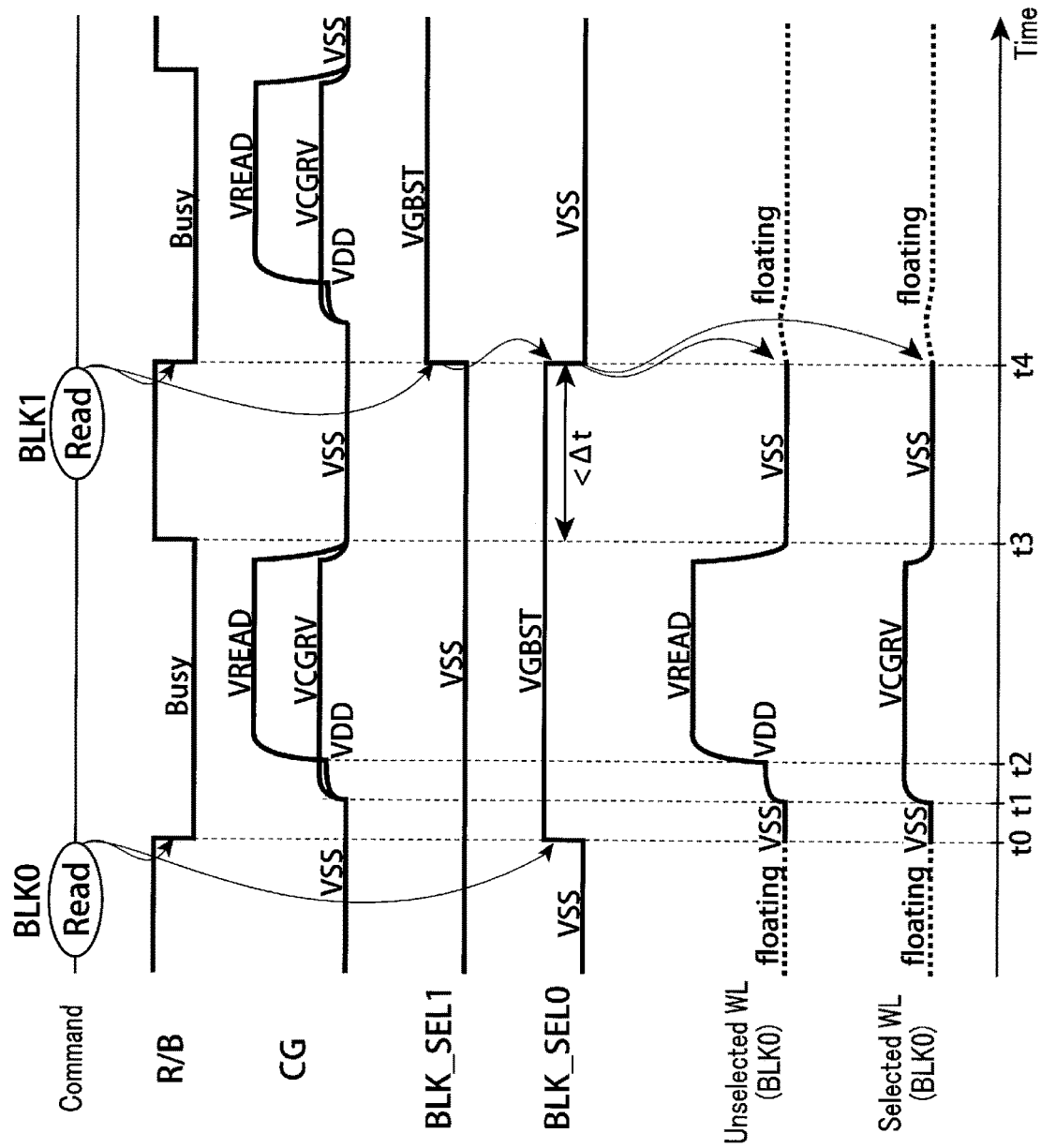
F I G. 10

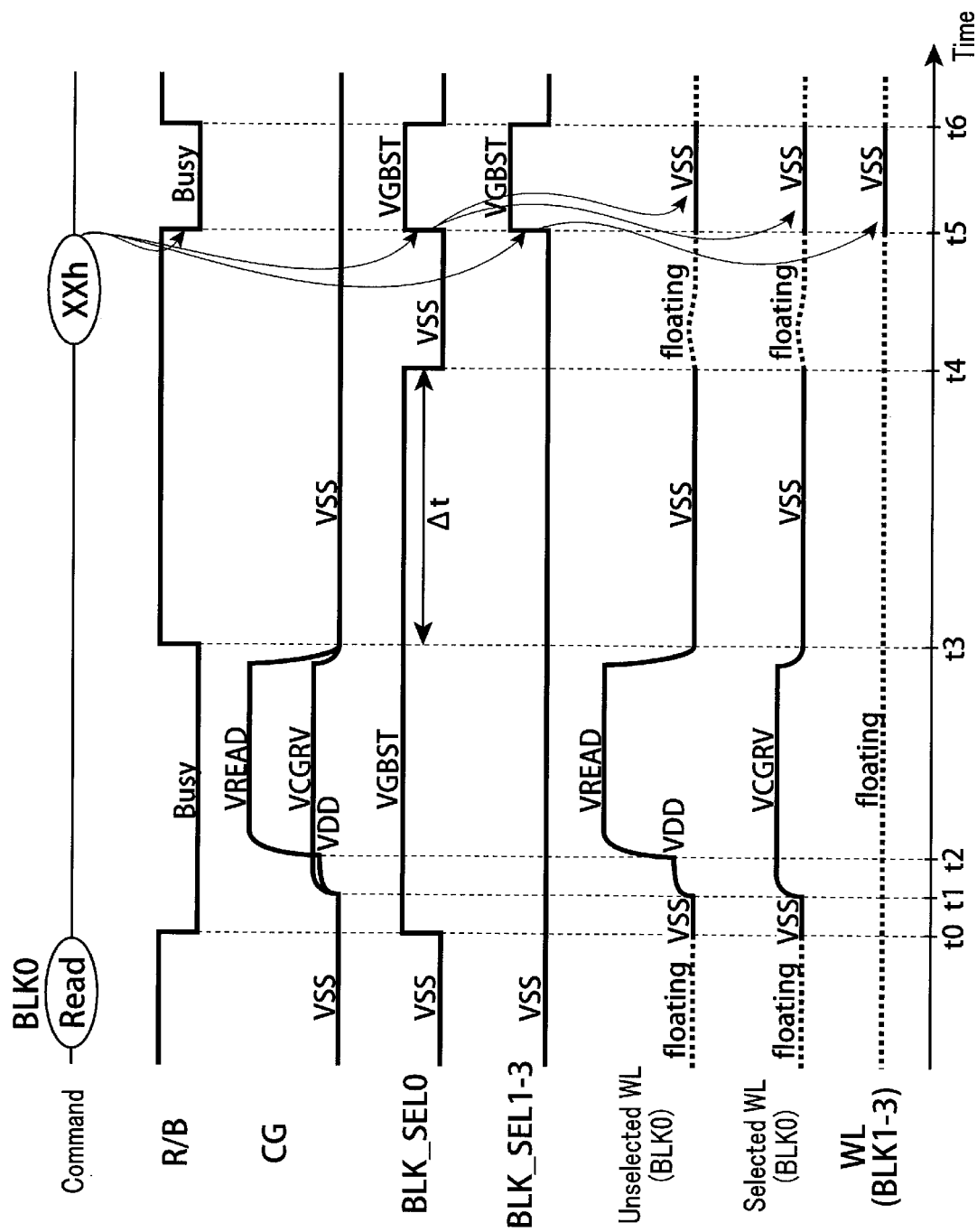
F I G. 11

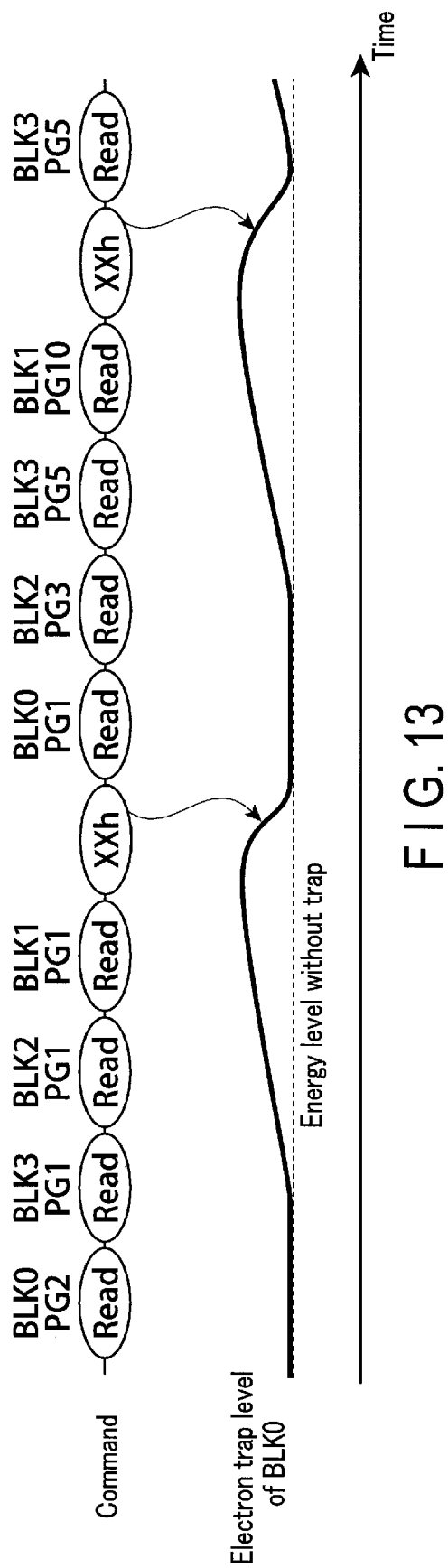
F I G. 13

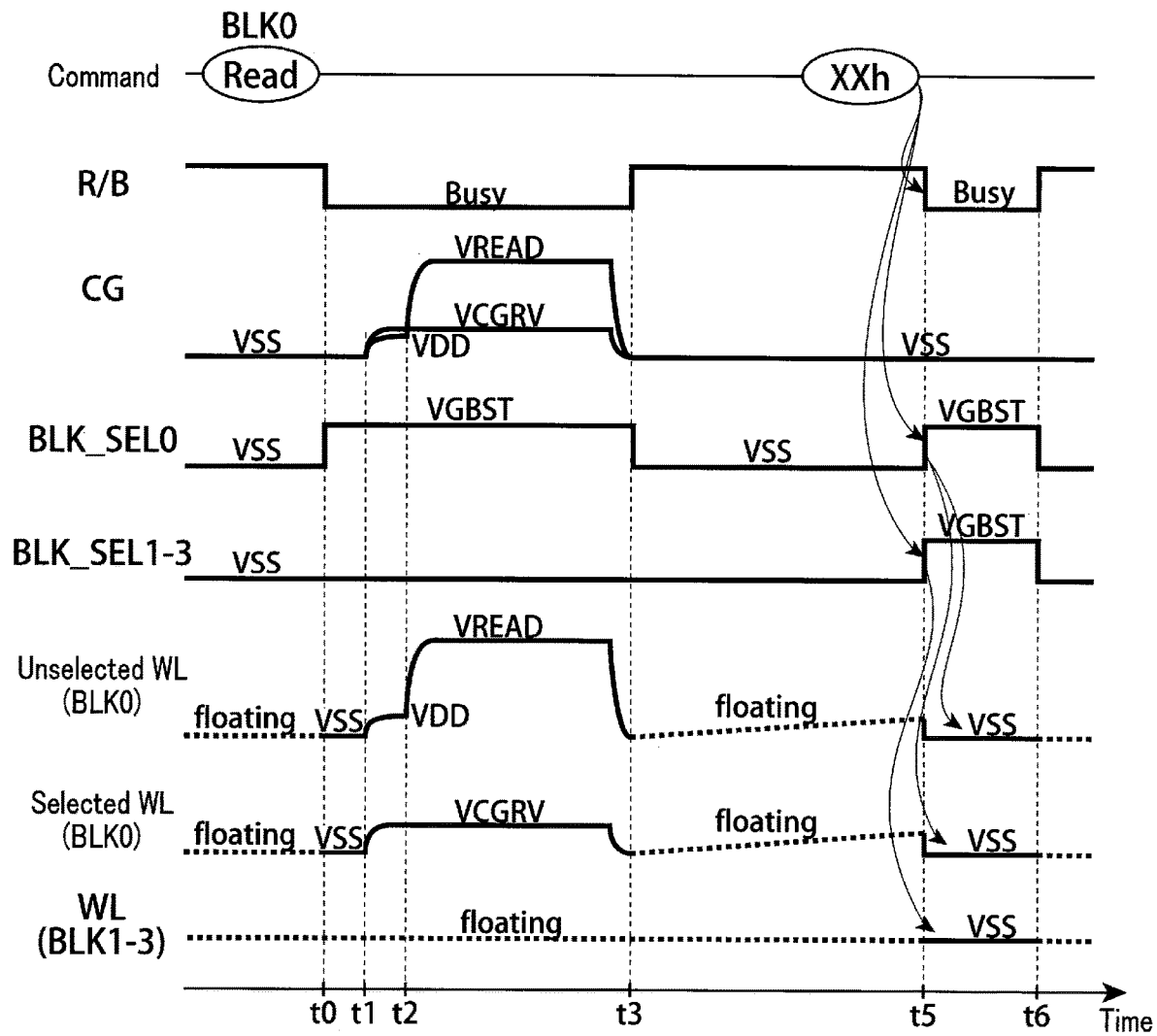
F I G. 14

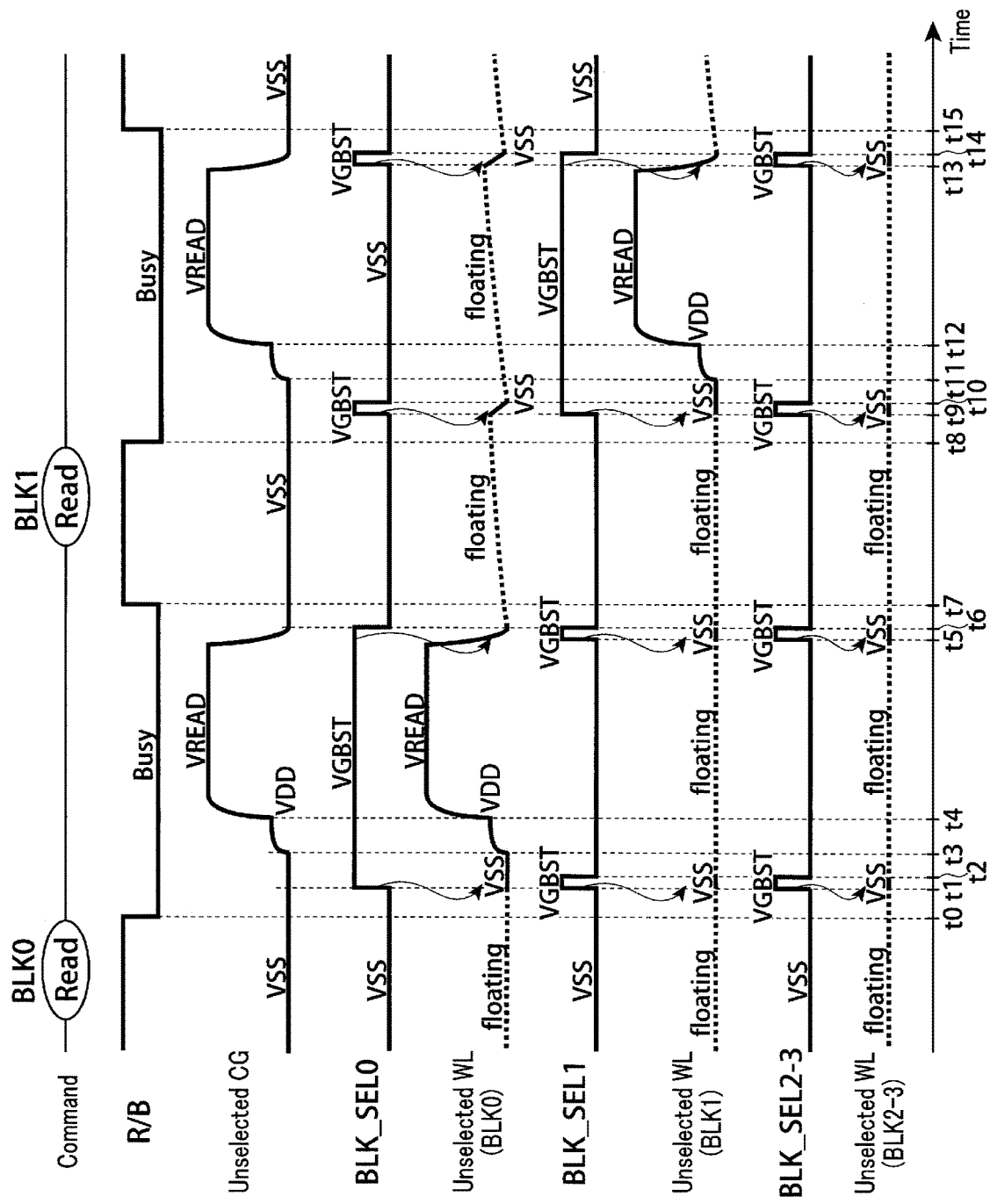
F I G. 16

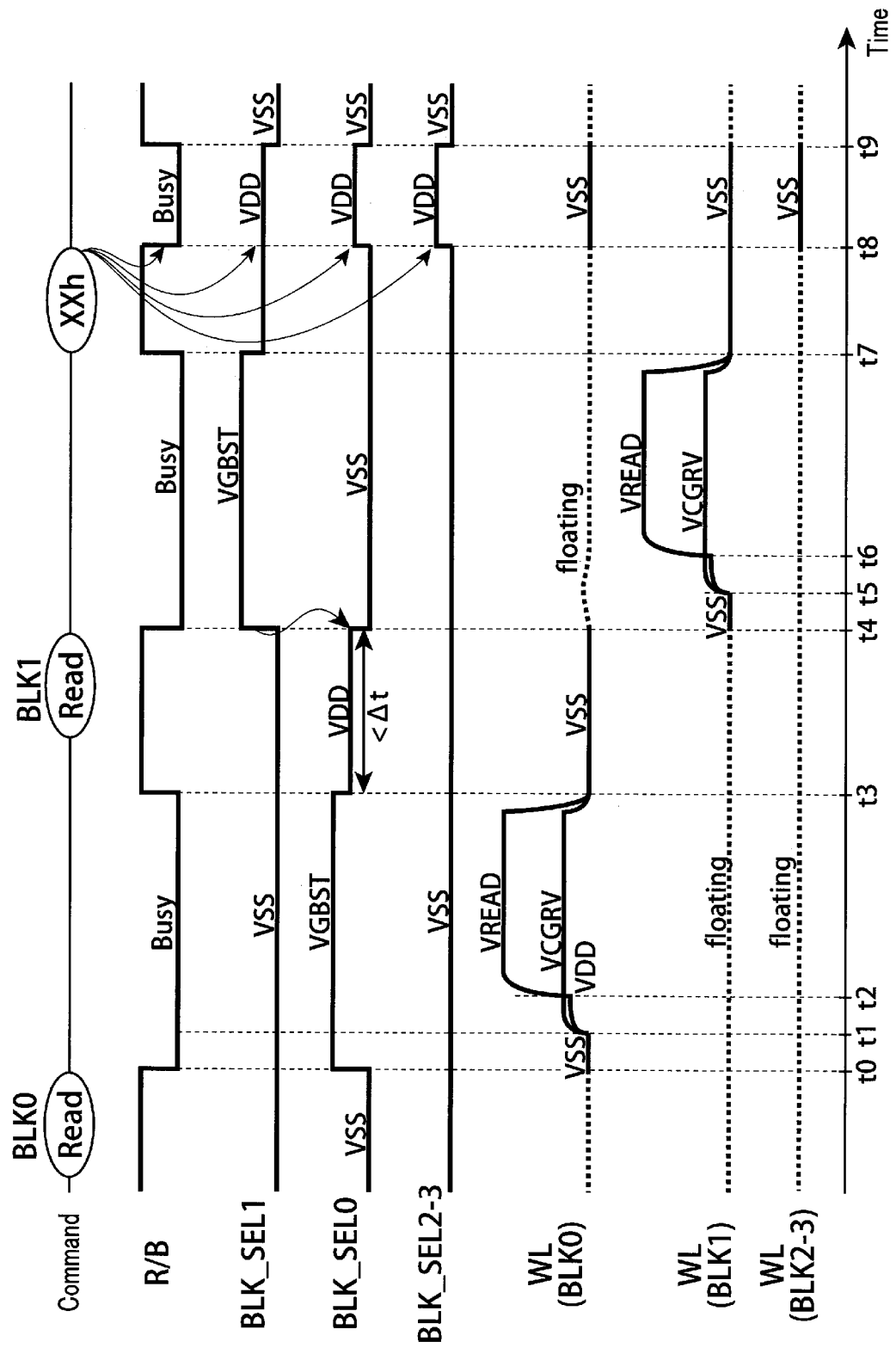
F I G. 20

MEMORY SYSTEM FOR RESTRAINING THRESHOLD VARIATION TO IMPROVE DATA READING

CROSS-REFERENCE TO RELATED APPLICATIONS

This application is based upon and claims the benefit of priority from Japanese Patent Application No. 2017-180531, filed Sep. 20, 2017, the entire contents of which are incorporated herein by reference.

FIELD

Embodiments described herein relate generally to a memory system.

BACKGROUND

A semiconductor memory in which memory cells are three dimensionally arranged is known.

BRIEF DESCRIPTION OF THE DRAWINGS

FIG. 1 illustrates a block diagram of a memory system according to the first embodiment;

FIG. 4 illustrates a circuit diagram of a row decoder and a driver circuit according to the first embodiment;

FIG. 6 illustrates a timing chart of a command sequence and various signals at the time of a data read operation according to the first embodiment;

FIGS. 10, 11, and 12 illustrate timing charts of a command sequence and various signals at the time of a data read operation according to the third embodiment;

FIG. 13 illustrates a command sequence and a graph of an electron trap level according to the third embodiment;

FIGS. 14 and 15 illustrate timing charts of a command sequence and various signals at the time of a data read operation according to the fourth embodiment;

FIG. 16 illustrates a timing chart of a command sequence and various signals at the time of a data read operation according to the fifth embodiment;

FIG. 20 illustrates a timing chart of a command sequence and various signals at the time of a data read operation according to a modification of the first to sixth embodiments.

DETAILED DESCRIPTION

Figure 2:
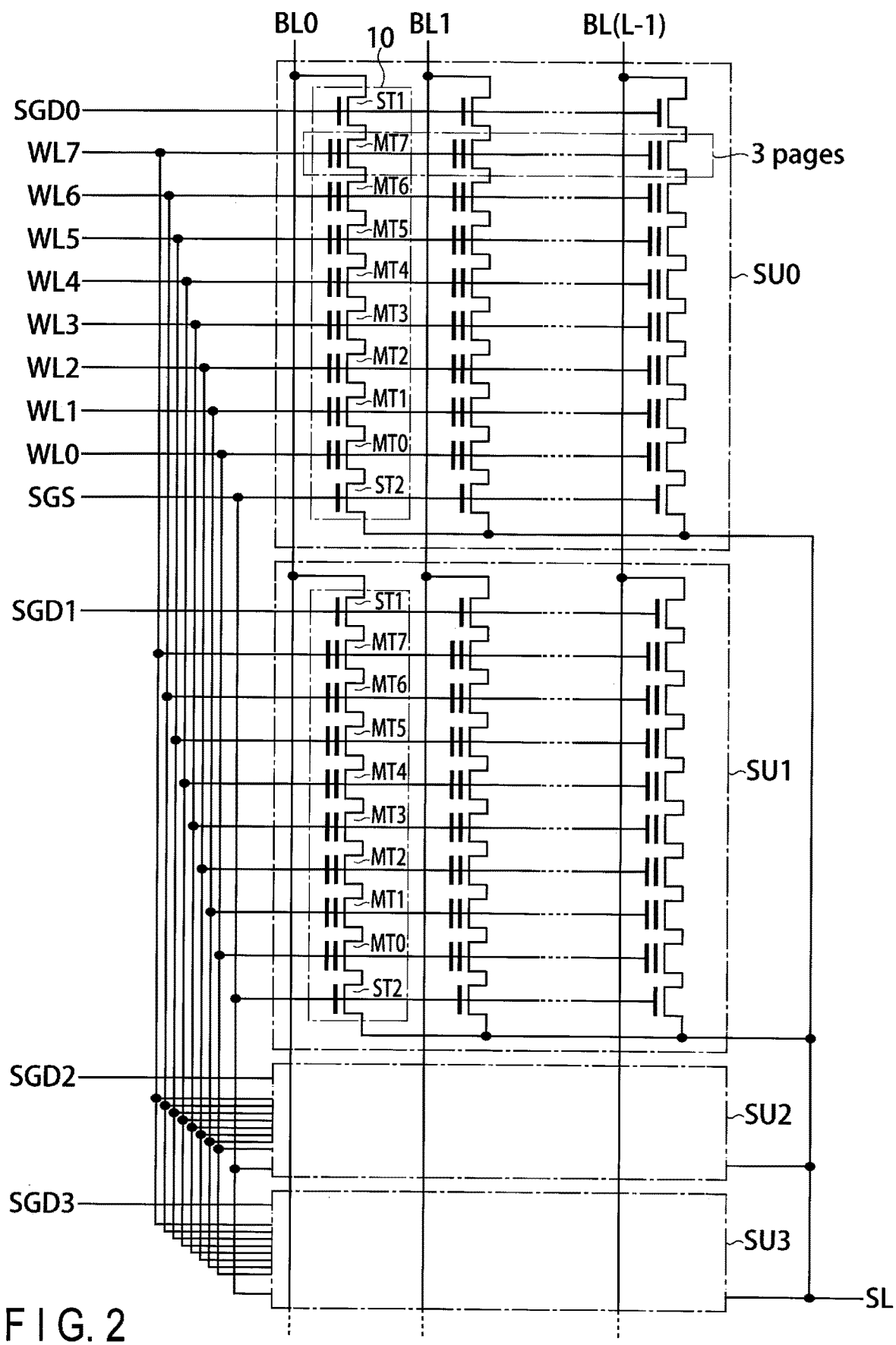
FIGS. 2 and 3 illustrate a circuit diagram and a sectional view showing a block according to the first embodiment.

In general, according to one embodiment, a memory system includes: a semiconductor memory capable of storing data; and a controller capable of reading data from the semiconductor memory. The semiconductor memory includes: a first block including a plurality of first memory cells three-dimensionally stacked above a semiconductor substrate; a plurality of first word lines coupled to the first memory cells; a first row decoder which includes a plurality of first transistors capable of coupling the plurality of first word lines to a plurality of first signal lines, and a first block decoder supplying a first block selection signal to gates of the plurality of first transistors; and a driver circuit transferring voltages to the first signal lines. When the controller issues a data read command for data held in the first block to the semiconductor memory, the semiconductor memory outputs a busy signal notifying the controller that the semiconductor memory is in a busy state. In the busy state, the first block decoder asserts the first block selection signal and turns on the first transistors to allow the first transistors to transfer a first voltage to a selected first word line, and a second voltage larger than the first voltage to unselected other first word lines. After data is read from the first block and the semiconductor memory outputs a ready signal notifying the controller that the semiconductor memory is in a ready state, the first block decoder continues asserting the first block selection signal until a lapse of a first period, the driver circuit transfers a third voltage smaller than the first voltage to the first signal lines, and when the first period passes, the first block decoder negates the first block selection signal.

1. First Embodiment

A memory system according to the first embodiment will be described. A memory system including a NAND flash memory as a semiconductor storage device will be exemplified below.

1.1 Configuration 1.1.1 Overall Configuration of Memory System

A rough overall configuration of the memory system according to this embodiment will be described first with reference to FIG. 1.

As shown in FIG. 1, a memory system 1 includes a NAND flash memory 100 and a controller 200. The NAND flash memory 100 and the controller 200 may form one semiconductor device, for example, in combination. Examples of the semiconductor device may be a memory card such as an SD™ card, and an SSD (Solid State Drive). The controller 200 may be configured, for example, in an SoC (system on chip).

The NAND flash memory 100 includes a plurality of memory cells, and non-volatilely stores data. The controller 200 is connected to the NAND flash memory 100 via a NAND bus and connected to a host device 300 via a host bus. The controller 200 controls the NAND flash memory 100, and accesses the NAND flash memory 100 in response to a command received from the host device 300. The host device 300 may be, for example, a digital camera or a personal computer, and the host bus may be, for example, a bus in compliance with the SD™ interface specification. The NAND bus transmits/receives signals according to the NAND interface specification.

1.1.2 Configuration of Controller 200

Details of the configuration of the controller 200 will be further described with reference to FIG. 1. As shown in FIG. 1, the controller 200 includes a host interface circuit 210, an internal memory (RAM) 220, a processor (CPU) 230, a buffer memory 240, a NAND interface circuit 250, and an Error Checking and Correcting (ECC) circuit 260.

The host interface circuit 210 is connected to the host device 300 via the host bus, and transfers commands and data received from the host device 300 to the processor 230 and the buffer memory 240. The host interface circuit 210 also transfers data in the buffer memory 240 to the host device 300 in response to an instruction from the processor 230.

The processor 230 controls all operations of the controller 200. For example, if a write command is received from the host device 300, in response to the write command, the processor 230 issues a write instruction to the NAND interface circuit 250. Similar operations are performed in data reading and erasing. The processor 230 also executes various kinds of processes such as wear leveling to manage the NAND flash memory 100. The operations of the controller 200, which will be described below, may be achieved by execution of software (e.g. firmware) by a processor, or may be achieved by hardware.

The NAND interface circuit 250 is connected to the NAND flash memory 100 via the NAND bus, and controls communications with the NAND flash memory 100. Based on an instruction received from the processor 230, the NAND interface circuit 250 transmits various signals to the NAND flash memory 100 and receives various signals from the NAND flash memory 100.

The buffer memory 240 temporarily holds data to be written in or data read from the NAND flash memory 100.

The internal memory 220 may be, for example, a semiconductor memory such as a DRAM or an SRAM, and is used as the work space of the processor 230. The internal memory 220 holds, for example, firmware configured to manage the NAND flash memory 100, and various kinds of management tables.

The ECC circuit 260 performs error detection and error correction processes for data stored in the NAND flash memory 100. That is, at the time of writing of data, the ECC circuit 260 generates an error correction code and adds it to the data to be written. At the time of reading of data, the ECC circuit 260 decodes the data read from the NAND flash memory 100.

1.1.3 Configuration of NAND Flash Memory 100
1.1.3.1 Overall Configuration of NAND Flash Memory 100

The configuration of the NAND flash memory 100 will be described next. As shown in FIG. 1, the NAND flash memory 100 includes a memory cell array 110, row decoders 120 (120-0 to 120-3), a driver circuit 130, a sense amplifier 140, an address register 150, a command register 160, and a sequencer 170.

The memory cell array 110 comprises a plurality of blocks BLK each including a plurality of nonvolatile memory cells arranged in rows and columns. FIG. 1 shows four blocks BLK0 to BLK3 as an example. The memory cell array 110 stores data given by the controller 200.

The row decoders 120-0 to 120-3 are provided to correspond to the blocks BLK0 to BLK3, respectively. Each row decoder 120-0 to 120-3 selects memory cells in the corresponding block BLK in a row direction.

The driver circuit 130 applies voltages to a selected block BLK via the row decoder 120.

At the time of data reading, the sense amplifier 140 senses data read from the memory cell array 110 and performs a necessary operation. The sense amplifier 140 outputs this data DAT to the controller 200. At the time of data writing, the sense amplifier 140 transfers the write data DAT received from the controller 200 to the memory cell array 110.

The address register 150 holds an address ADD received from the controller 200. The command register 160 holds a command CMD received from the controller 200.

The sequencer 170 controls overall operations of the NAND flash memory 100 based on various kinds of information held by the registers 150 and 160.

1.1.3.2 Configuration of Blocks BLK

The configuration of the blocks BLK will be described next with reference to FIG. 2. As shown in FIG. 2, each block BLK includes, for example, four string units SU (SU0 to SU3). Each string unit SU includes a plurality of NAND strings 10.

Each NAND string 10 includes, for example, eight memory cell transistors MT (MT0 to MT7) and select transistors ST1 and ST2. Each memory cell transistor MT includes a control gate and a charge accumulation layer, and non-volatilely holds data. The memory cell transistors MT are connected in series between the source of the select transistor ST1 and the drain of the select transistor ST2.

The gates of the select transistors ST1 in the string units SU0 to SU3 are connected to select gate lines SGD0 to SGD3, respectively. On the other hand, the gates of the select transistors ST2 in the string units SU0 to SU3 are commonly connected to, for example, a select gate line SGS. The gates of the select transistors ST2 in the different string units may, of course, be connected to different select gate lines SGS0 to SGS3. The control gates of the memory cell transistors MT0 to MT7 in the same block BLK are commonly connected to word lines WL0 to WL7, respectively.

The drains of the select transistors ST1 of the NAND strings 10 on the same column in the memory cell array 110 are commonly connected to bit lines BL (BL0 to BL(L-1), wherein (L-1) is a natural number of 2 or more). That is, the bit lines BL commonly connect the NAND strings 10 among the plurality of blocks BLK. Furthermore, the sources of the select transistors ST2 are commonly connected to source lines SL.

That is, the string unit SU includes the plurality of NAND strings 10 connected to the different bit lines BL and connected to the same select gate line SGD. The block BLK includes a plurality of string units SU that share word lines WL. The memory cell array 110 includes a plurality of blocks BLK that share bit lines BL.

Figure 3:
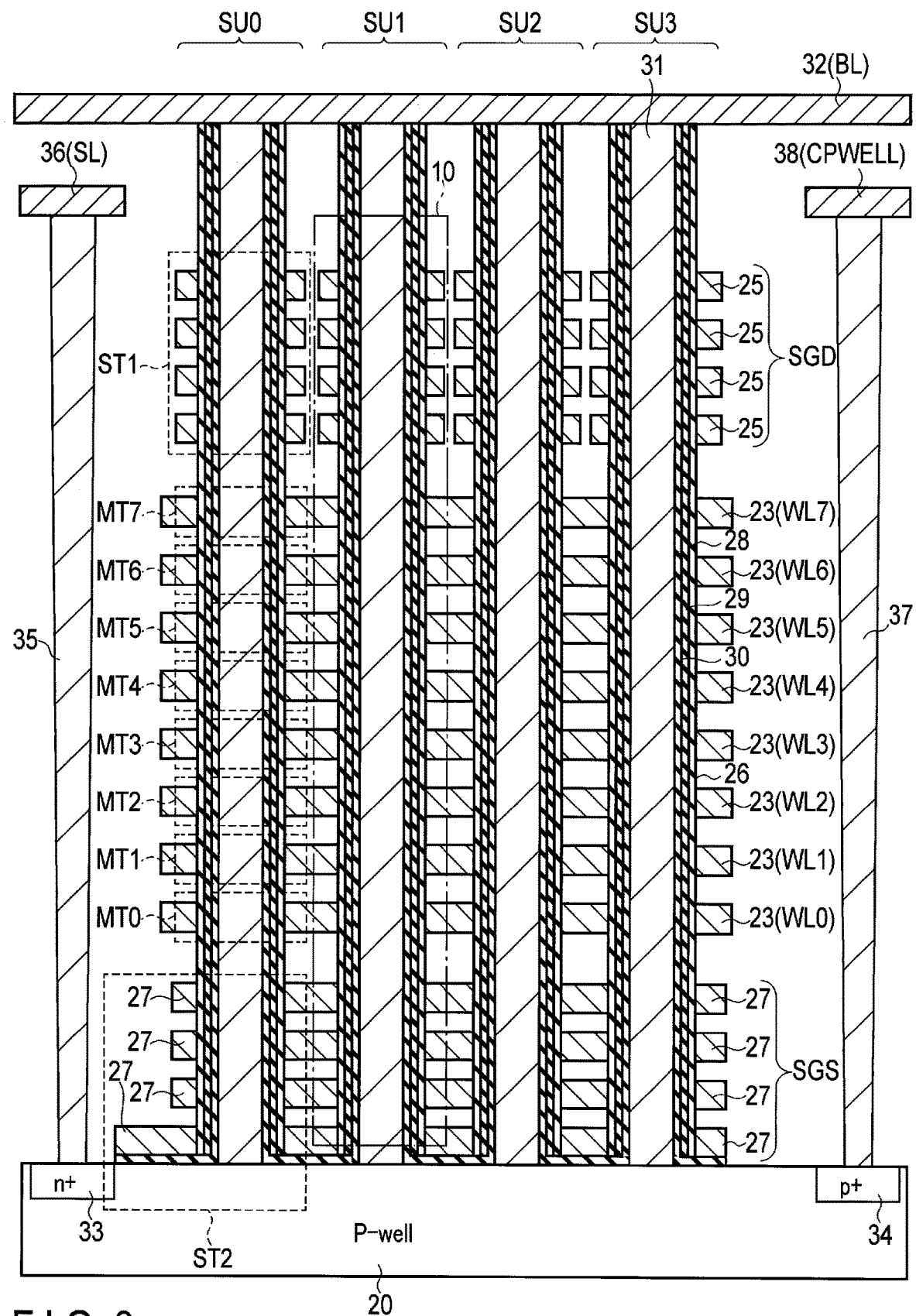

FIG. 3 is a sectional view of a partial region of the blocks BLK. As shown in FIG. 3, the plurality of NAND strings 10 is formed on a p-type well region 20. That is, on the well region 20, interconnect layers 27 of, for example, four layers, functioning as the select gate line SGS, interconnect layers 23 of eight layers functioning as the word lines WL0 to WL7, and, interconnect layers 25 of, for example, four layers, functioning as the select gate lines SGD are stacked in turn. Insulating films (not shown) are formed between the stacked interconnect layers.

Semiconductor pillars 31 extending through the interconnect layers 25, 23, and 27 and reaching the p-well region 20 are formed. Gate insulating films 30, charge accumulation layers (insulating films) 29, and block insulating films 28 are formed in turn on the side surfaces of the semiconductor pillars 31, whereby memory cell transistors MT and the select transistors ST1 and ST2 are formed. Each semiconductor pillar 31 functions as a current path of the NAND string 10, and becomes a region on which a channel of each transistor is formed. The upper ends of the semiconductor pillars 31 are connected to a metal interconnect layer 32 functioning as a bit line BL.

An $n^+$-type impurity diffusion layer 33 is formed in the surface region of the p-well region 20. A contact plug 35 is formed on the diffusion layer 33. The contact plug 35 is connected to a metal interconnect layer 36 functioning as the source line SL. In addition, a $p^+$-type impurity diffusion layer 34 is formed in the surface region of the p-well region 20. A contact plug 37 is formed on the diffusion layer 34. The contact plug 37 is connected to a metal interconnect layer 38 functioning as a well interconnect CPWELL. The well interconnect CPWELL is an interconnect used to apply a voltage to the conductors 31 via the well region 20.

A plurality of configurations described above is arranged in the depth direction of the sheet of FIG. 3. Each string unit SU is formed as a group of the plurality of NAND strings 10 arranged in the depth direction.

In this example, one memory cell transistor MT may hold, for example, 3-bit data. The 3-bit data will be referred to as a lower bit, a middle bit, and an upper bit from the lower bit. A group of lower bits held by memory cells connected to the same word line WL in the same string unit SU will be referred to as a lower page, a group of middle bits held thereby will be referred to as a middle page, and a group of upper bits held thereby will be referred to as an upper page. That is, three pages are assigned to one word line WL. Accordingly, a "page" may be defined as a part of a memory space formed by memory cells connected to the same word line. Writing and reading of data are done on a page basis. In this example, since one string unit SU includes eight word lines, each string unit SU configures (3×8)=24 pages, and since one block BLK includes four string units SU, each block configures (24×4)=96 pages.

Note that data erasing may be done for each block BLK or in a unit smaller than the block BLK. An erasing method is described in, for example, U.S. patent application Ser. No. 13/235,389 "NONVOLATILE SEMICONDUCTOR MEMORY DEVICE" filed on Sep. 18, 2011. A data erasing method is also described in, for example, U.S. patent application Ser. No. 12/694,690 "NON-VOLATILE SEMICONDUCTOR STORAGE DEVICE" filed on Jan. 27, 2010. Also, a data erasing method is described in, for example, U.S. patent application Ser. No. 13/483,610 "NONVOLATILE SEMICONDUCTOR MEMORY DEVICE AND DATA ERASE METHOD THEREOF" filed on May 30, 2012. These patent applications are incorporated by reference in this specification in their entirety.

Furthermore, the memory cell array 110 may have different configurations. That is, a configuration of the memory cell array 110 is described in, for example, U.S. patent application Ser. No. 12/407,403 "THREE DIMENSIONAL STACKED NONVOLATILE SEMICONDUCTOR MEMORY" filed on Mar. 19, 2009. Configurations are also described in U.S. patent application Ser. No. 12/406,524 "THREE DIMENSIONAL STACKED NONVOLATILE SEMICONDUCTOR MEMORY" filed on Mar. 18, 2009, U.S. patent application Ser. No. 12/679,991 "NON-VOLATILE SEMICONDUCTOR STORAGE DEVICE AND METHOD OF MANUFACTURING THE SAME" filed on Mar. 25, 2010, and U.S. patent application Ser. No. 12/532,030 "SEMICONDUCTOR MEMORY AND METHOD FOR MANUFACTURING SAME" filed on Mar. 23, 2009. These patent applications are incorporated by reference in this specification in their entirety.

1.1.3.3 Configuration of Row Decoders 120

The configurations of the row decoders 120 and the driver circuit 130 will be described next. The row decoders 120-0 to 120-3 are provided to correspond to the blocks BLK0 to BLK3, respectively, and provided to have the blocks BLK0 to BLK3 selected or unselected. FIG. 4 shows the configurations of the row decoder 120-0 and the driver circuit 130. Note that the configurations of the row decoders 120-1 to 120-3 are the same as the row decoder 120-0.

As shown in FIG. 4, the row decoder 120-0 comprises a block decoder 40 and MOS transistors of a high-voltage n channel enhancement type (E type: threshold is positive) 50 (50-0 to 50-7), 51 (51-0 to 51-3), 52 (52-0 to 52-3), 53, and 54. Any of the transistors 50 to 54 is of a high withstand voltage type. The impurity concentrations of their channel regions, for example, are equal, and their threshold voltages are also equal.

The block decoder 40, when writing, reading, and erasing data, decodes a block address given by, for example, the address register 150. The block decoder then generates signals BLK_SEL0 and RDECADn according to the decoding result. More specifically, when a block address BA corresponds to and designates the block BLK0, the block decoder 40 asserts the signal BLK_SEL0 ("H" level in this example), and negate the signal RDECADn ("L" level in this example, e.g. VSS (0 V) or negative potential VBB). The voltage of the asserted signal BLK_SEL0 is VGBST at the time of data reading, and VPGMH at the time of data writing. In a selected block BLK, the voltages VGBST and VPGMH are voltages for allowing the transistors 50 to transfer a voltage VREAD to be applied to unselected word lines WL, and a voltage VPGM to be applied to a selected word line WL, wherein VGBST>VREAD, and VPGMH>VPGM. In addition, when a block address BA does not correspond to and designate the block BLK0, the block decoder 40 negates the signal BLK_SEL0 ("L" level in this example, e.g. VSS), and asserts the signal RDECADn ("H" level in this example, e.g. VDD).

The transistors 50, when the corresponding block BLK0 is selected, transfer voltages to the word lines WL of this selected block BLK0. The transistors 50-0 to 50-7 provide connections between the word lines WL0 to WL7 of the corresponding block BLK0 and signal lines CG0 to CG7, respectively, and are given the signal BLK_SEL0 at their gates. Accordingly, when the block BLK0 is selected, the transistors 50-0 to 50-7 are turned on in the row decoder 120-0, and the word lines WL0 to WL7 of the block BLK0 are connected to the signal lines CG0 to CG7. On the other hand, in the row decoders 120-1 to 120-3 corresponding to the unselected blocks BLK1 to BLK3, the transistors 50-0 to 50-7 are turned off, and the word lines WL0 to WL7 are disconnected from the signal lines CG0 to CG7.

Transistors 51 and 52 will be described next. The transistors 51 and 52, when the corresponding block BLK0 is selected, transfer voltages to the select gate lines SGD0 to SGD3. The transistors 51-0 to 51-3 provide connection between the select gate lines SGD0 to SGD3 of the corresponding block BLK0, and signal lines SGDD0 to SGDD3, respectively, and are given the signal BLK_SEL0 at their gates. The transistors 52-0 to 52-3 provide connections between the select gate lines SGD0 to SGD3 of the corresponding block BLK0, and a node SGD_COM, respectively, and are given a signal RDECADn at their gates. To the node SGD_COM, a voltage for turning the select transistors ST1 off, such as VSS and a negative voltage VBB, is applied. Accordingly, when a block BLK0 is selected, the transistors 51-0 to 51-3 are turned on, and the transistors 52-0 to 52-3 are turned off in the row decoder 120-0. The select gate lines SGD0 to SGD3 of the selected block BLK0 are therefore connected to the signal lines SGDD0 to SGDD3. On the other hand, in the row decoders 120-1 to 120-3 corresponding to the unselected blocks BLK1 to BLK3, the transistors 51-0 to 51-3 are turned off, and the transistors 52-0 to 52-3 are turned on. The select gate lines SGD0 to SGD3 of the unselected blocks BLK1 to BLK3 are therefore connected to the node SGD_COM.

Transistors 53 and 54 are for transferring a voltage to the select gate lines SGS. The connections and operations thereof are equivalent to those of the transistors 51 and 52 wherein the select gate lines SGD, the signal lines SGDD0 to SGDD 3, and the node SGD_COM are replaced by the select gate lines SGS, the signal lines SGSD, and the node SGS_COM, respectively. A voltage for turning the select transistors ST2 off is applied to the node SGS_COM. That is, if the block BLK0 is selected, the transistor 53 is turned on, and the transistor 54 is turned off in the row decoder 120-0. On the other hand, in the row decoders 120-1 to 120-3 corresponding to the unselected blocks BLK1 to BLK3, the transistor 53 is turned off, and the transistor 54 is turned on.

1.1.3.4 Configuration of Driver Circuit 130

The configuration of the driver circuit 130 will be described next with continued reference to FIG. 4. The driver circuit 130 is used in common with the row decoders 120-0 to 120-3. The driver circuit 130 transfers a voltage necessary for writing, reading, and erasing of data to the signal lines CG0 to CG7, SGDD0 to SGDD3, and SGS.

As shown in FIG. 4, the driver circuit 130 comprises CG drivers 60 (60-0 to 60-7), SGD drivers 61 (61-0 to 61-3), and an SGS driver 62.

First, the CG drivers 60 will be described. The CG drivers 60-0 to 60-7 transfer required voltages to the signal lines CG0 to CG7, respectively. At the time of reading data, the CG driver 60 corresponding to a selected word line WL transfers a read voltage VCGRV to a corresponding signal line CG. This voltage is transferred to the selected word line WL via the transistor 50 in the row decoder 120 corresponding to the selected block BLK. On the other hand, the CG drivers 60 corresponding to unselected word lines WL transfer a voltage VREAD to a corresponding signal lines CG.

The SGD drivers 61 will be described next. The SGD drivers 61-0 to 61-3 transfer required voltages to the signal lines SGDD0 to SGDD3, respectively. At the time of reading data, the SGD driver 61 corresponding to a string unit SU including a selected memory cell transfers a voltage VSG to a corresponding signal line SGDD. This voltage is transferred to the corresponding select gate line SGD via the corresponding transistor 51. Voltage VSG is a voltage required for turning a select transistor ST1 on at the time of reading. The SGS driver 62, in the same manner, transfers a required voltage to a signal line SGSD.

1.2 Data Read Operation

Figure 5:
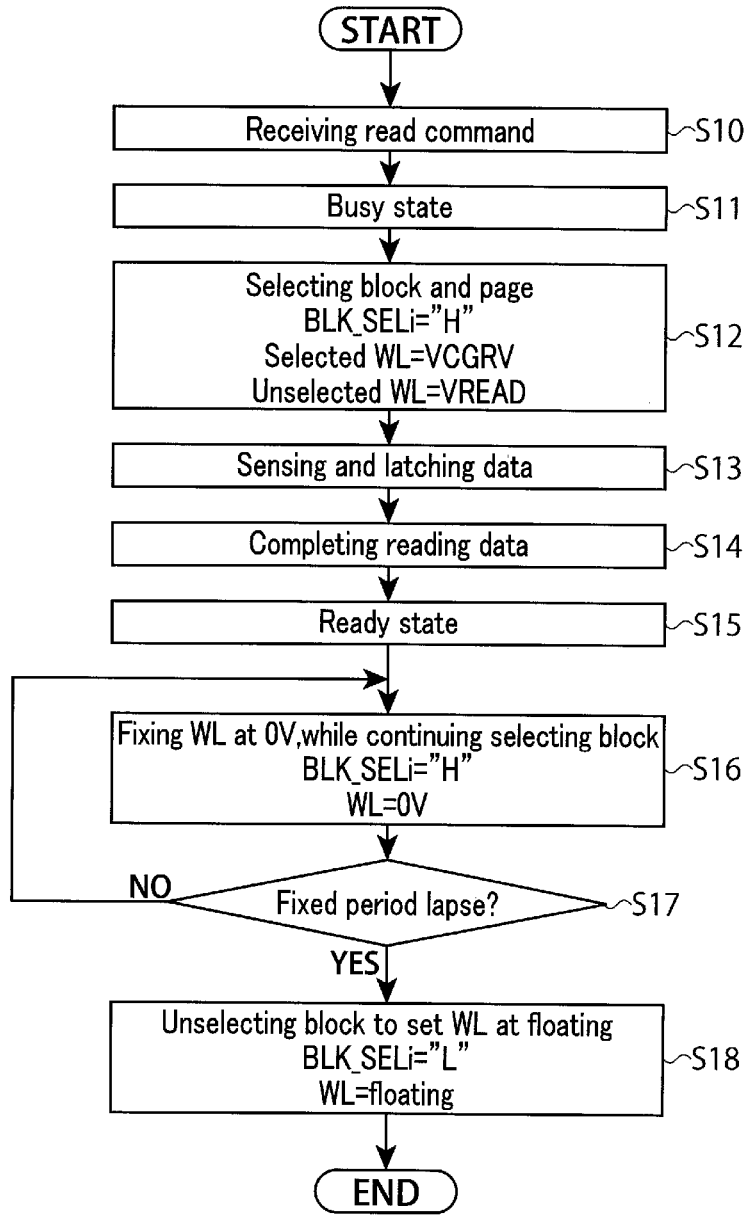
FIG. 5 illustrates a flowchart of a data read operation according to the first embodiment.

A data read operation according to this embodiment will be described next with reference to FIGS. 5 and 6. FIG. 5 illustrates a flowchart showing the operations of the NAND flash memory 100 at the time of the data read operation. FIG. 6 illustrates a timing chart of a command and various signals transmitted from the controller 200 to the NAND flash memory 100. Note that in FIG. 6, the operations of the NAND flash memory 100 are executed under, for example, control of the sequencer 170.

As shown in FIG. 6, in the NAND flash memory 100 before receiving a read command from the controller 200, the CG drivers 60 apply VSS to the signal lines CG. The block decoders 40 of the row decoders 120-0 to 120-3 set the signal lines BLK_SEL0 to BLK_SEL3 at a low level "L" (e.g. VSS). Accordingly, the word lines WL of the blocks BLK0 to BLK3 are in an electrically floating state. At time t0, the NAND flash memory 100 receives a read command from the controller 200 (step S10). The read command includes, for example, the following command sequence: <00h><ADD><ADD><ADD><ADD><ADD><30h>

That is, an address input is declared by a command "00h," and an address ADD is inputted over five cycles. By this address ADD, a block BLK and a page targeted for the data read operation are designated. In response to the input of a command "30h," the sequencer 170 initiates the data reading from the memory cell, and the NAND flash memory 100 enters a busy state (step S11, time t0). Note that the busy state is a state where the NAND flash memory 100 cannot receive normal commands (other than commands for interruption) from an outside, and a ready state means a command receivable state.

The block decoder 40 of the row decoder 120 sets a signal BLK_SELi ("i" is an integer of any of 0 to 3 in this example) at "H" level (VGBST) (time t0), if it corresponds to the selected block BLK according to the block address. The example of FIG. 6 shows a case where the block BLK0 is selected. Furthermore, the driver circuit 130, according to the page address, transfers voltage VCGRV to a signal line CG corresponding to the selected word line, and transfers voltage VREAD to the other signal lines CG (times t1 and t2). As a result, the voltage VCGRV is applied to the selected word line WL of the selected block BLK0, and the voltage VREAD is applied to the unselected word lines WL (step S12). The voltage VCGRV is used for a reference value when reading data from a memory cell connected to the selected word line. Whether data held in the memory cell is, for example, "0" or "1" is determined by whether or not the memory cell is turned on when the voltage VCGRV is applied. Note that FIG. 6 shows as an example that the signal BLK_SEL is asserted simultaneously with the time when the NAND flash memory 100 gets busy at time t0. However, the timing when the signal BLK_SEL is asserted may be subsequent to time t0, and may be during a period of the busy state. This is similarly applied to the second embodiment to be described later.

Data is read from a memory cell transistor MT connected to the selected word line WL to a bit line BL, and the sense amplifier 140 senses the read data and imports it into a latch circuit in the NAND flash memory (step S13).

If the data reading is completed in such a manner (step 514, time t3), the voltage of each interconnection is reset to VSS, and the NAND flash memory 100 is in the ready state (step S15).

Even after the data reading is completed, the row decoder 120 (e.g. the row decoder 120-0 in the example of FIG. 6) maintains the state where the block BLK0 is selected. That is, a selected BLK_SELi (i=0 in this example) maintains the "H" level, and the driver circuit 130 transfers VSS to the signal lines CG0 to CG7. Thereby, even after the NAND flash memory 100 transitions to the ready state, the transistors 50 of the row decoder 120-0 remain in the "ON" state, and are allowed to apply the voltage VSS to the word lines WL0 to WL7 in the selected block BLK0 (step S16, time t3).

A period Δt during which the voltage VSS is applied to the word lines WL0 to WL7 is predetermined in, for example, the sequencer 170. If this period Δt passes, the signal BLK_SELi (i=0 in this example) transitions to the "L" level (VSS), and the MOS transistors 50 are turned off. As a result, the word lines WL0 to WL7 enter the electrically floating state. Note that this period Δt may be measured by a timer circuit etc. provided in the NAND flash memory 100. In addition, the start time of the period Δt may be the time when the NAND flash memory 100 becomes ready, the timing when the word lines WL are set at VSS from VREAD or VCGRV, or the timing when a CG driver 60 corresponding to an unselected word line WL switches a voltage to be transferred from VREAD to VSS. In any case, because the signal BLK_SELi (i=0 in this example) remains in the "H" level, the word lines WL do not become floating, and remain in VSS during the period Δt.

If a predetermined period Δt passes (step S17, YES), in response to an instruction from, for example, the sequencer 170 or the aforementioned timer circuit, the row decoder 120 negates the signal BLK_SELi (i=0 in this example) (e.g. set at VSS in this example). As a result, the transistors 50 of the selected row decoder 120 are turned off, and the word lines WL become electrically floating (step S18).

1.3. Effects According to this Embodiment

According to the configuration of this embodiment, it is possible to improve the operation reliability of the memory system 1. This effect will be described below.

Figure 7:
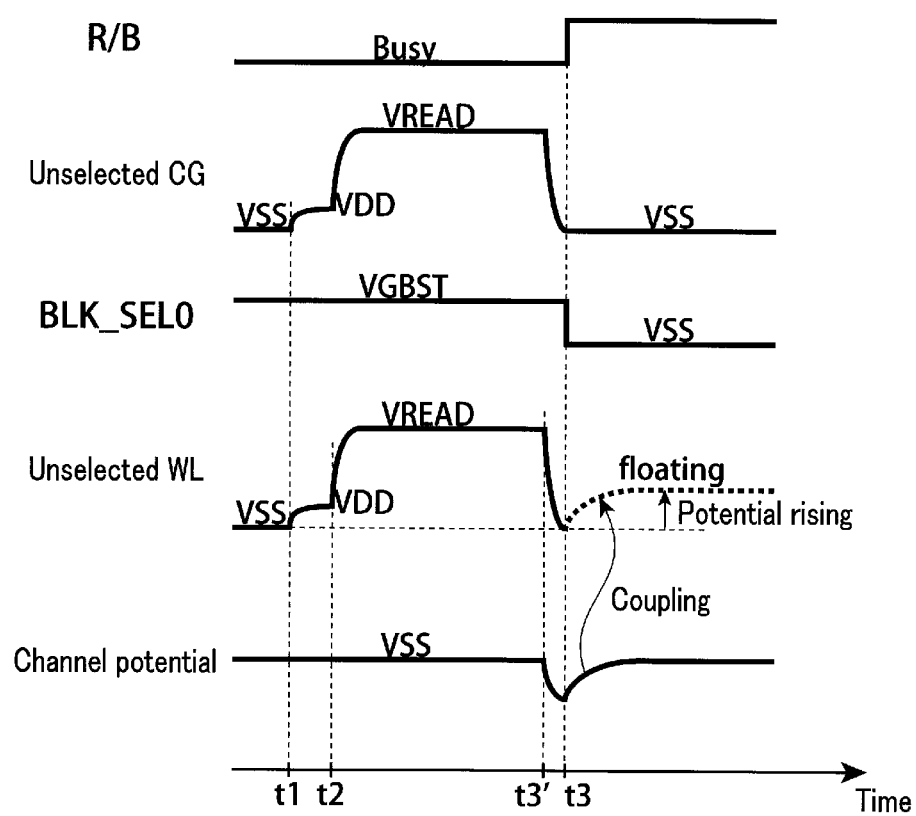
FIG. 7 illustrates a timing chart of various signals at the time of a data read operation.

FIG. 7 is a timing chart of a case where the signal BLK_SEL0 is negated simultaneously with the completion of data reading as a comparison example of this embodiment. As shown in FIG. 7, the voltages of the unselected word lines WL decline from VREAD to VSS during the short period of t3' to t3. At the same time, the potential of a channel (in semiconductor pillars 31) also declines. Then, the potential may be undershot to a negative value. After that, the potential of the channel returns to VSS V (after time t3). Then, since the word lines WL are in the electrically floating state after time t3, the potential of the word lines WL rises by coupling with the channel, and reaches, for example, several Volts.

Figure 8:
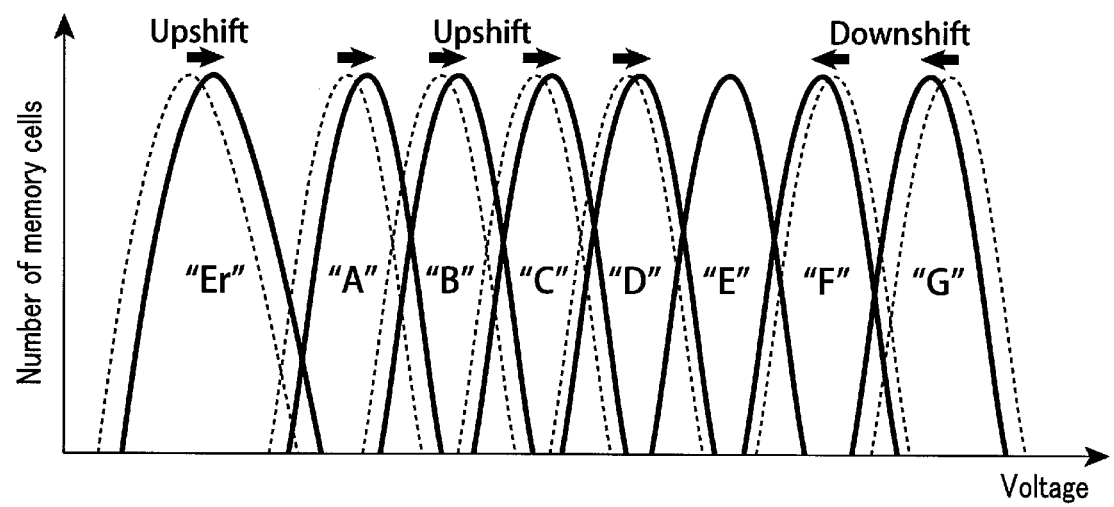
FIG. 8 illustrates a graph showing the threshold distributions of memory cells.

This rise of the potential of the word lines can be the cause of incorrect reading. This is shown in FIG. 8. FIG. 8 shows threshold distributions when each memory cell holds 3-bit data ("Er," "A," "B," . . . "G" data) as an example. In FIG. 8, the broken line shows threshold distributions when there is no influence of coupling, and the solid line shows threshold distributions when there is such an influence.

As shown in FIG. 8, if an influence of coupling is exerted, threshold distributions whose threshold voltages are relatively low ("Er" to "D") shift toward the high-voltage side, and threshold distributions whose threshold voltages are high ("F" to "G") shift toward the low-voltage side. This would be because, influenced by the rise of the potential of the word line WL caused by coupling, in a memory cell whose threshold is low, electrons in the channel are trapped through the gate insulating film 30 while in a memory cell whose threshold is high, electrons in a charge accumulation layer trapped move toward the block layer 28. Even if the period during which the voltage rise of the word line WL is caused by coupling lasts, for example, only 10 to 100 ms, it can take around an hour to let a shifted threshold return. This is a phenomenon specific to the configuration of memory cells that are three-dimensionally stacked. Note that in FIG. 8, although a case where the boundary between the threshold distributions that shift toward the high-voltage side and the threshold distributions that shift toward the low-voltage side is in the "E" level is shown as an example; this is, of course, not limited to the "E" level.

Thus, in this embodiment, as described with reference to FIG. 6, even immediately after the potential of the word lines WL is made to decline to VSS from VREAD, the driver circuit 130 and the row decoder 120 continue providing VSS to the word lines WL during a predetermined period Δt. That is, the word lines WL are discharged. Thereby, even if the channel potential is varied by coupling, the potential of the word lines WL remains at VSS. Accordingly, it is possible to restrain threshold variation caused by trapping of electrons, and improve accuracy of data reading.

Note that a longer period Δt is more preferable. However, for actual use, the period Δt may preferably be as long as the period during which VREAD is applied to the word lines WL, more preferably twice as long as such a period, or more specifically within the range of 5 μs to 1000 μs. Of course, even if the period Δt is shorter than those periods, the effect can be obtained to some extent. However, by setting the period Δt at a value within the above preferable periods, the effect of reducing the number of error bits at the time of data reading will be remarkable.

2. Second Embodiment

A memory system according to the second embodiment will be described next. This embodiment relates to a case where a request for accessing another block BLK is made during the above period Δt of applying VSS described in the first embodiment (the period of discharging word lines WL). Only differences from the first embodiment will be described below.

2.1 Data Read Operation

Figure 9:
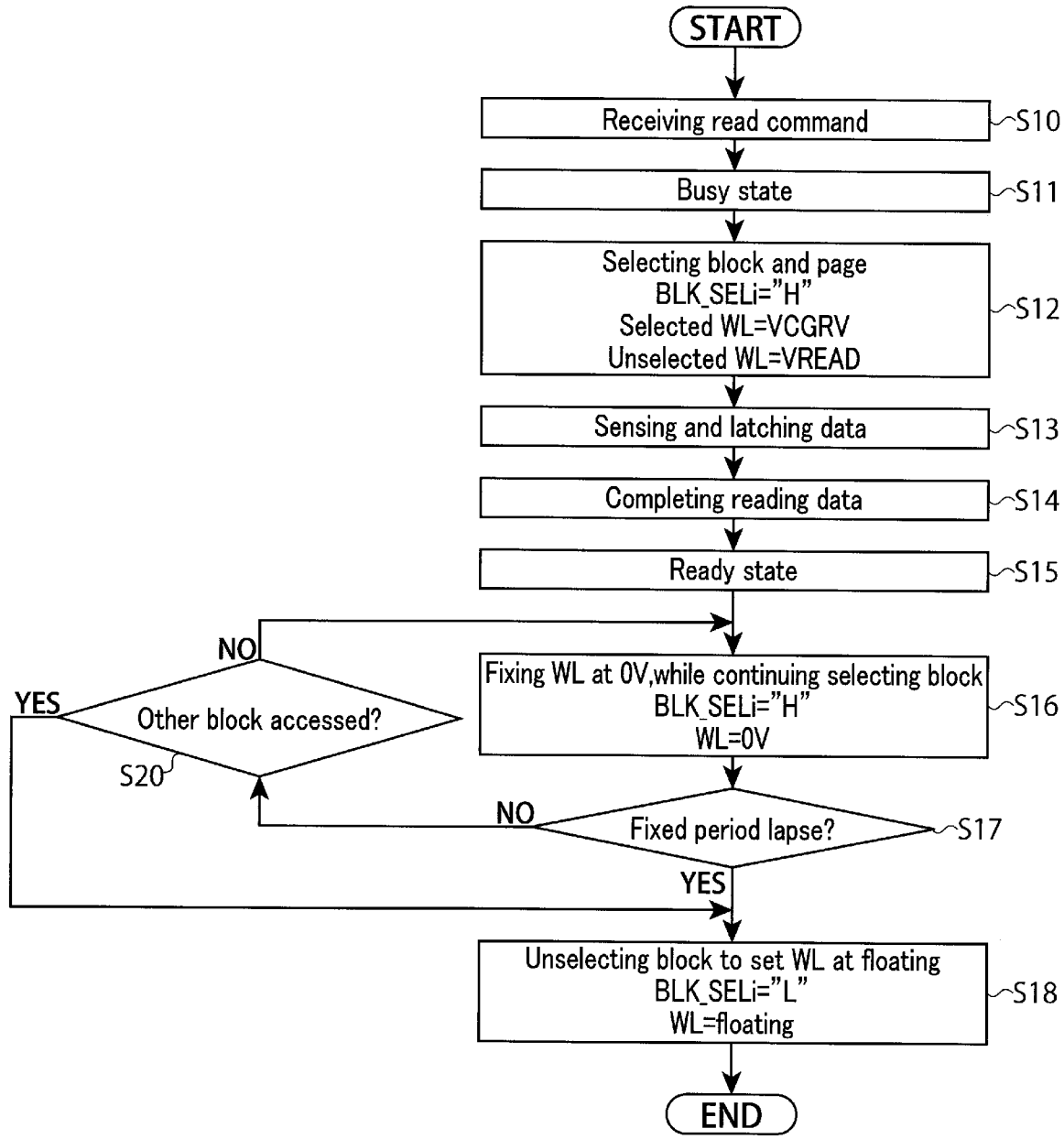
FIG. 9 illustrates a flowchart of a data read operation according to the second embodiment.

A data read operation according to this embodiment will be described with reference to FIGS. 9 and 10. FIG. 9 is a flowchart showing the operations of the NAND flash memory 100 the data read operation. FIG. 10 is a timing chart of commands and various signals transmitted from the controller 200 to the NAND flash memory 100. These figures correspond to FIGS. 5 and 6 described in the first embodiment, respectively.

As shown in FIG. 9, this embodiment differs from the first embodiment in that in step S16, when an access to a block BLK different from a block BLK selected in step S12 is made (step S20, YES), even if the predetermined period Δt does not pass, the processes proceed to step S18. The example of FIG. 10 shows a case where after issuance of a read command for the block BLK0, another read command for another block BLK1 is issued before the predetermined period Δt lapses. As shown in FIG. 10, the signal BLK_SEL0 remains in the "H" level even after time t3, and the voltage VSS is applied to the word lines WL of the block BLK0 at time t3. If the NAND flash memory 100 receives a read command for the block BLK1 from the controller 200 in such a state, being triggered by the reception, the block decoder 40 of the row decoder 120 (e.g. 120-0) negates the signal BLK_SEL0 (time t4). Note that the sequencer 170, for example, may issue an instruction for the block decoder 40 of the row decoder 120-0 to negate the signal BLK_SEL0. As a result, the word lines WL of the blocks BLK0 are set to the electrically floating state. On the other hand, the NAND flash memory 100 comes to be in the busy state, and the block decoder 40 of the row decoder 120-1 asserts the signal BLKSEL1, whereby data is read from the block BLK1.

2.2 Effects According to this Embodiment

According to this embodiment, being triggered by another block access, the discharging (application of VSS) of word lines WL is stopped. Thereby, even in the condition that commands are frequently issued by the controller 200, it is possible to avoid disturbing operations of the memory system 1.

Note that in the example of FIG. 10, descriptions are made with respect to a case where subsequent to a read command, another read command is issued; the subsequent command may be a write command or an erase command. Alternatively, the case may be a case where the sequencer 170, for example, voluntarily accesses a block BLK without following a command from the controller 200.

3. Third Embodiment

A memory system according to the third embodiment will be described next. This embodiment is for providing a command for forcibly discharging all the word lines WL of all the blocks BLK in the above first and second embodiments. Only differences from the first and second embodiments will be described below.

3.1 Data Read Operation

FIG. 11 is a timing chart of commands and various signals transmitted from the controller 200 to the NAND flash memory 100 in the data read operation of a first example of this embodiment, and corresponds to FIG. 6 described in the first embodiment.

As shown in FIG. 11, the word lines WL of the block BLK0 are set to the floating state at time t4, which is the same as the first embodiment. In this embodiment, at time t5 after t4, the controller issues a command "XXh. " The command "XXh" is a discharge command, and commands the NAND flash memory 100 to discharge all the word lines WL of all the blocks BLK.

The NAND flash memory 100 that receives the command "XXh" becomes busy, and all the block decoders 40 of the row decoders 120-0 to 120-3 set signals BLK_SEL0 to BLK_SEL3 at the "H" level (VGBST). This operation may be performed according to an instruction from, for example, the sequencer 170. In addition, the driver circuit 130 transfers VSS to all the signal lines CG0 to CG7. As a result, VSS is applied to all the word lines WL0 to WL7 of all the blocks BLK0 to BLK3.

Figure 12:
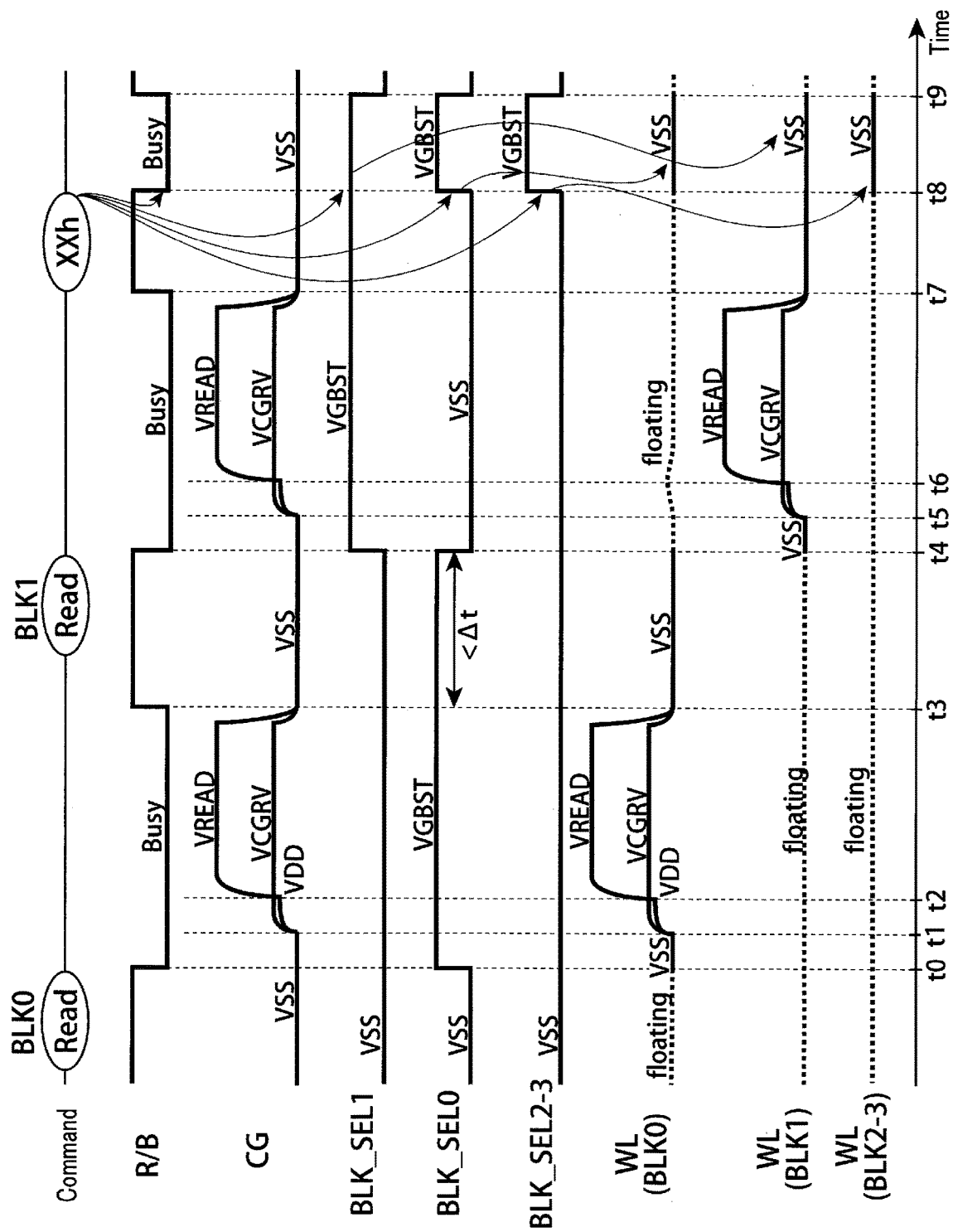

FIG. 12 shows the data read operation of a second example of this embodiment which is an example of issuance of the discharge command "XXh" in FIG. 10 described in the second embodiment.

As shown in FIG. 12, after data are read from the blocks BLK0 and BLK1 in turn, the controller 200 issues the command "XXh" at time t8. Then, the signal BLK_SEL1 remains in the "H" level, and the signals BLK SEL0, BLK_SEL2, andBLK_SEL3 are set at the "H" level. Thereby, VSS is applied to all the word lines WL0 to WL7 of all the blocks BLK0 to BLK3. Note that by the issuance of the command "XXh" while the signal BLK_SEL1 is at the "H" level, the discharge period (times t7 to t9) of the block BLK1 may exceed the predetermined period Δt.

The operations of the controller 200 according to this embodiment will be described next. In the controller 200, for example, in the memory (a queue) of the CPU 230, read commands received from the host device 300 are stored as follows:

1. Block BLK0: page PG2
2. Block BLK3: page PG1
3. Block BLK2: page PG1
4. Block BLK1: page PG1
5. Block BLK0: page PG1
6. Block BLK2: page PG3
7. Block BLK3: page PG5
8. Block BLK1: page PG10
9. Block BLK3: page PG5

As shown in FIG. 13, the controller 200 issues the read commands in the above order.

As shown in FIG. 13, after data is read from the block BLK0 first, the electron trap level of the block BLK0 rises. However, upon issuance of a command "XXh," the block BLK0 is reset to the state of no influence due to the electron trapping. In an example of FIG. 13, as an example, every time four read commands are issued, one command "XXh" is issued, and all the word lines WL of all the blocks BLK are discharged. However, each command "XXh" may be periodically issued, for example, for a desired period. Even when each command "XXh" is issued for the desired number of commands, the desired number may include not only the number of read commands but also the number of write commands or erase commands.

3.2 Effects According to this Embodiment

According to this embodiment, the controller 200 can issue, to the NAND flash memory 100, a command to discharge all the word lines WL of all the blocks BLK. Thereby, by setting the potential of the floating word lines WL at VSS, it is possible to reduce an influence on threshold variations of the memory cells due to the electron trapping.

Note that the blocks subject to the discharging are not limited to all the blocks BLK, but may be any of the blocks BLK. Further, the word lines to be discharged are not limited to all the word lines WL, but may be a part of the word lines WL. Further, the controller 200 may monitor the state of accesses to the NAND flash memory 100, and identify one or more blocks BLK whose threshold variations appear significantly large to issue the discharge commands to the or those identified blocks BLK.

4. Fourth Embodiment

A memory system according to the fourth embodiment will be described next. In this embodiment, in the above third embodiment, the word line discharge at the time of ordinary data read operations described in the first and second embodiments is omitted. In other words, the fourth embodiment corresponds to the above third embodiment in which the predetermined period Δt=0. Only differences from the above third embodiment will be described below.

4.1 Data Read Operation

Figure 15:
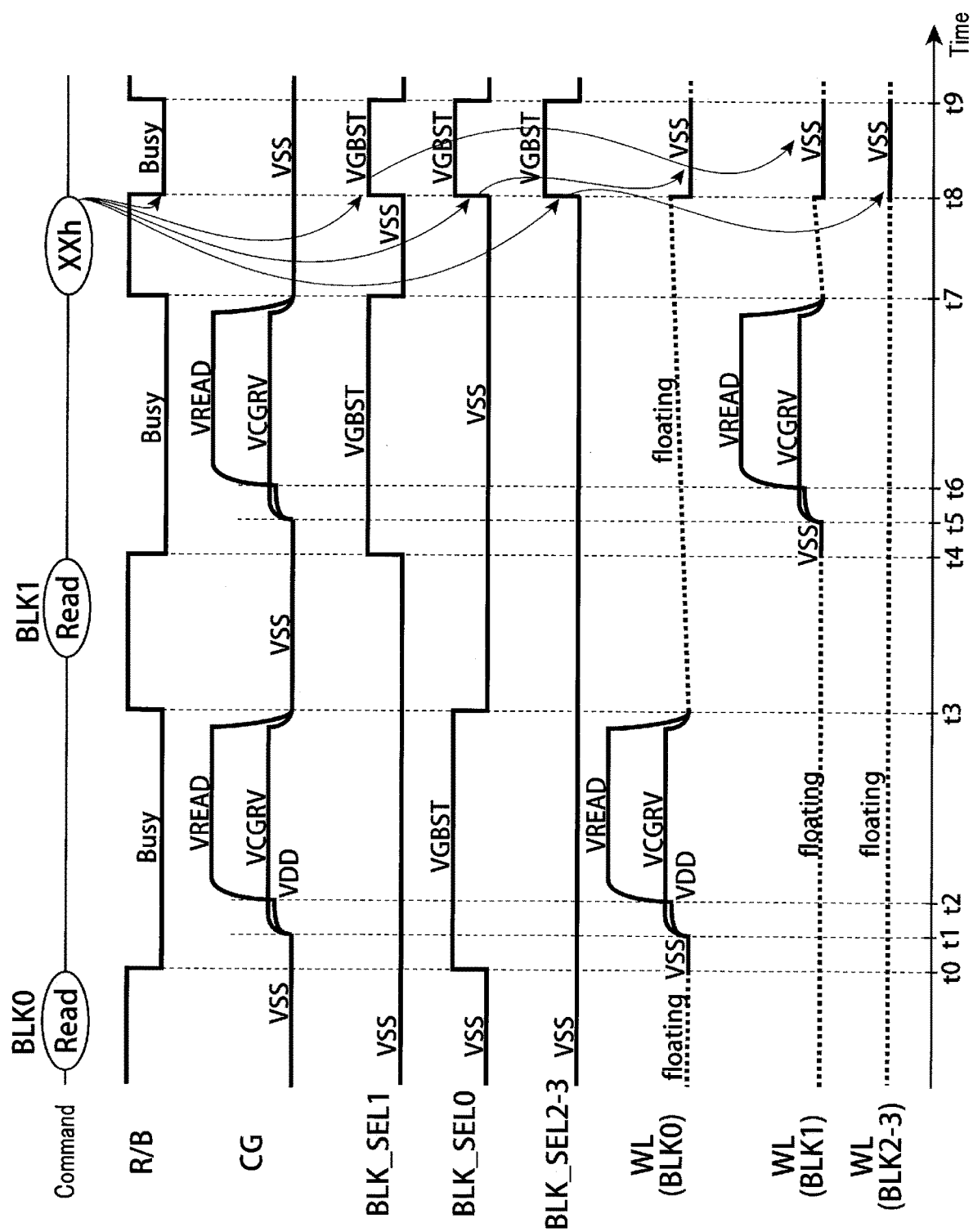

FIGS. 14 and 15 are timing charts of commands and various signals transmitted from the controller 200 to the NAND flash memory 100 in the data read operations according to this embodiment, and correspond to FIGS. 11 and 12 described in the third embodiment.

As shown in FIG. 14, if a read operation is completed at time t3, the block decoder 40 sets the signal line BLK_SEL0 at the "L" level (time t3). Accordingly, the word lines WL of the block BLK0 enter the floating state after time t3, and their potential is raised by coupling with the channel. However, with the controller issuing the command "XXh" at time t5, all the word lines WL of all the blocks BLK are discharged.

Similarly in an example of FIG. 15, all the word lines WL of the block BLK1 enter the floating state at time t7, and after that, in response to the command "XXh" at time t8, all the word lines WL of all the blocks BLK are discharged.

The others are similar to the corresponding features of the third embodiment. The controller 200 may issue the command "XXh", for example, periodically, or issue as desired according to the state of each block BLK.

4.2 Effects According to this Embodiment

According to this embodiment, effects similar to those of the above third embodiment can be obtained.

5. Fifth Embodiment

A memory system according to the fifth embodiment will be described next. This embodiment corresponds to an embodiment in which the NAND flash memory 100 voluntarily or autonomously discharges the word lines WL during the busy period without a need for the discharge command "XXh" as described with reference to the above fourth embodiment. Only differences from the above fourth embodiment will be described below.

5.1 Data Read Operation

FIG. 16 is a timing chart of commands and various signals transmitted from the controller 200 to the NAND flash memory 100 in the read operation according to this embodiment, and corresponds to FIG. 15 described in the fourth embodiment. However, note that the times described in the horizontal time axis do not match those in FIG. 15. An example of FIG. 16 shows a case where the signal BLK_SEL is asserted after the NAND flash memory 100 becomes busy, and the NAND flash memory 100 returns to the ready state after the signal BLK_SEL is negated.

As shown in FIG. 16, according to this embodiment where the command "XXh" is not required, when receiving a read command, being triggered by the read command, the NAND flash memory 100 discharges the word lines WL.

In the example of FIG. 16, when a read command for the block BLK0 is issued from the controller 200 at time t0, at time t1, the block decoder 40 of the row decoder 120-0 starts asserting the signal BLK_SEL0 for a period until time t6. At that time, for example, before and/or after data is sensed at the block BLK0 and imported into the latch circuit of the sense amplifier 140, the sequencer 170 causes the block decoders 40 in the row decoders 120-1 to 120-3 corresponding to the unselected blocks BLK1 to BLK3 to assert the signals BLK_SEL1 to BLK_SEL3 (e.g. VGBST).

More specifically, the sequencer 170, for example, instructs the row decoders 120-1 to 120-3 to assert those other signals BLK_SEL1 to BLK_SEL3, for example, at the timing when the signal BLK_SEL0 is asserted. In this case, the period during which the signals BLK_SEL1 to BLK_SEL3 are asserted is the period (t1 to t2) during which the signal BLK_SEL0 is asserted and the CG drivers 60 transfer the voltage VSS. This period may be shorter than the predetermined period Δt described in the first embodiment.

Alternatively, the sequencer 170, for example, instructs the row decoders 120-1 to 120-3 to assert the signals BLK_SEL1 to BLK_SEL3, for example, at time t5 that is a certain period before the timing when the signal BLK_SEL0 is negated. In this case, the period (t5 to t6) during which the signals BLK_SEL1 to BLK_SEL3 are asserted includes the period during which the signal BLK_SEL0 is asserted, and the CG drivers 60 switch a voltage to be transferred from VREAD to VSS, and the switching is completed and VSS is transferred. This period may also be shorter than the predetermined period Δt described in the first embodiment.

When the signals BLK_SEL1 to BLK_SEL3 are asserted during the above described period of t1 to t2, the rise timing of the signals BLK_SEL1 to BLK_SEL3 becomes the same as that of the signal BLK_SEL0. On the other hand, when the signals BLK_SEL1 to BLK_SEL3 are asserted during the period of t5 to t6, the fall timing of the signals BLK_SEL1 to BLK_SEL3 becomes the same as the fall timing of the signal BLK_SEL0.

This is the same as the time when a read command for the block BLK1 is issued after that (time t8). For example, during the period of times t9 to t10 and/or t13 to t14, the signals BLK_SEL0, BLK_SEL2, and BLK_SEL3 corresponding to the then unselected blocks BLK0, BLK2, and BLK3 are asserted.

5.2 Effects According to this Embodiment

According to this embodiment, effects similar to those of the above third embodiment can be obtained. That is, by frequently discharging the word lines WL even for a short period, the threshold variation of the memory cells can be prevented.

Note that the example of FIG. 16 shows a case where the signals BLK_SEL corresponding to the unselected blocks BLK are asserted during both of the periods before and after data is sensed. However, such signals may be asserted for at least either of those periods. In addition, a period during which the signals BLK_SEL are asserted is not limited, if the period is a period during which the potential of signal lines CG can discharge the word lines WL.

Furthermore, although a case where a read command is received is described in the example of FIG. 16, the example is also applicable to reception of a write command or an erase command.

6. Sixth Embodiment

A memory system according to the sixth embodiment will be described next. This embodiment corresponds to an embodiment of applying the above fifth embodiment to a data write operation. That is, it is an embodiment in which the discharge command "XXh" is not required, and the NAND flash memory 100 voluntarily or autonomously discharges the word lines WL during a data write operation period.

6.1 Data Write Operation

Figure 17:
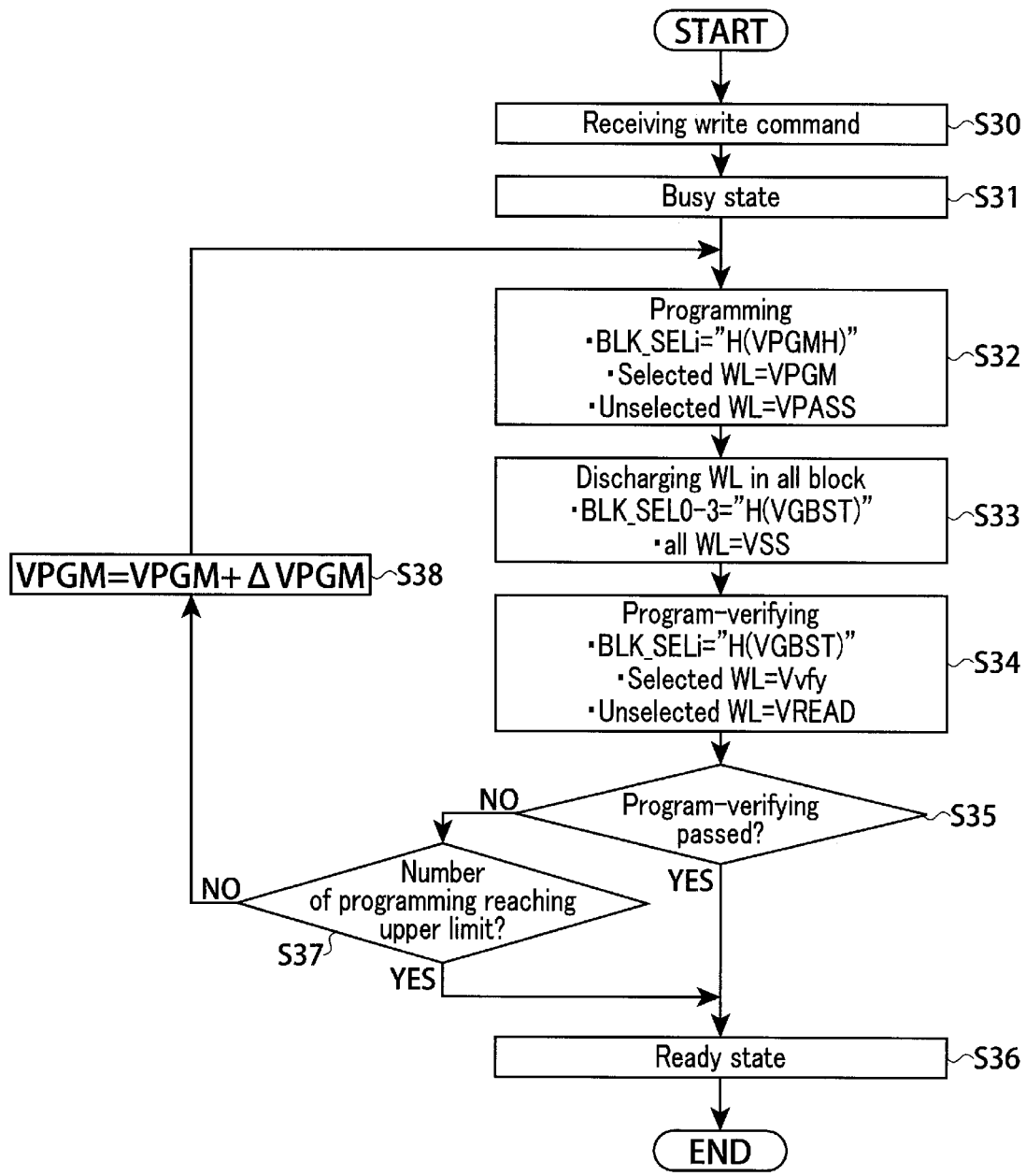
FIG. 17 illustrates a flowchart of a write operation according to the sixth embodiment.
Figure 18:
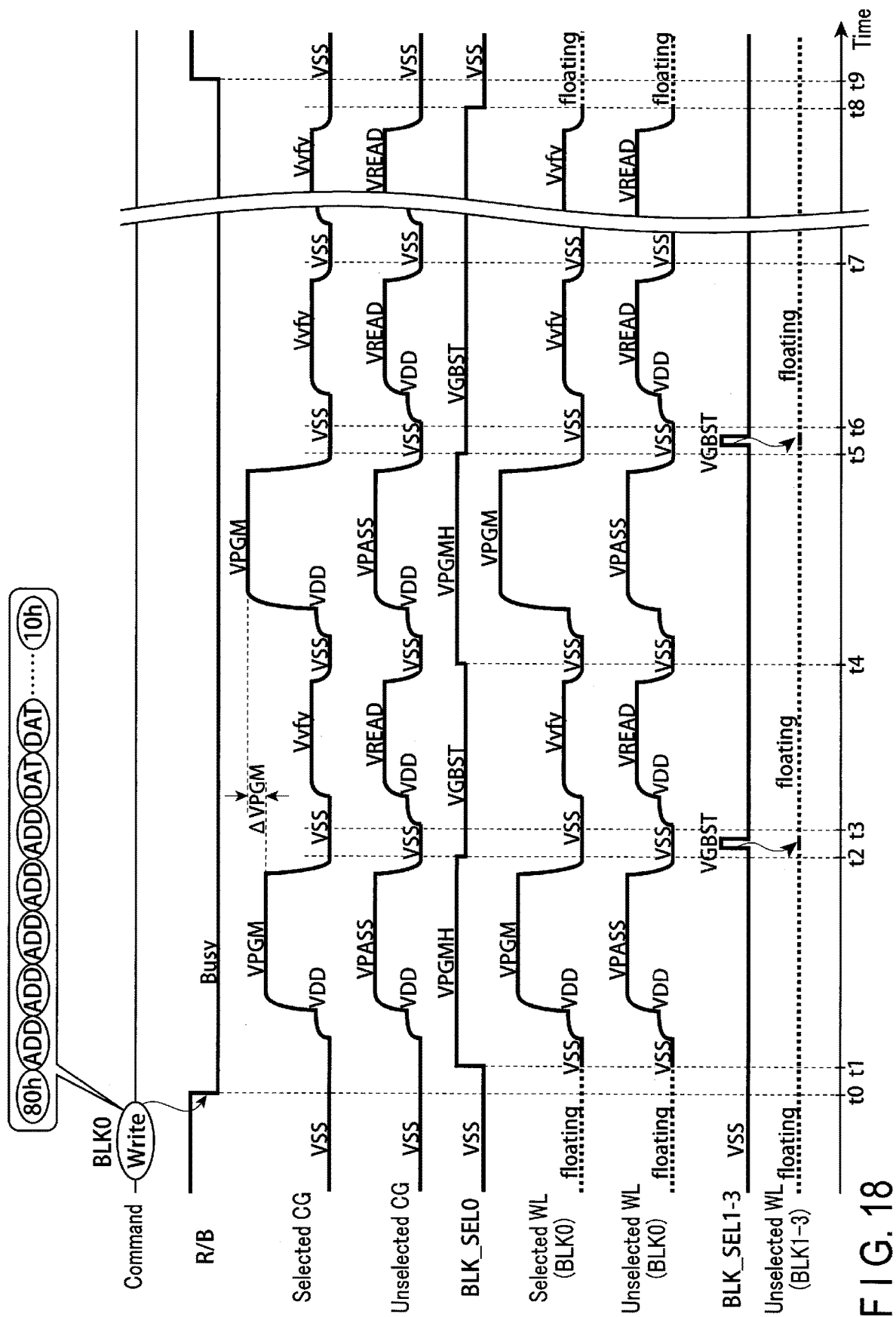
FIG. 18 illustrates a timing chart of a command sequence and various signals at the time of a write operation according to the sixth embodiment.

A data write operation according to this embodiment will be described with reference to FIGS. 17 and 18. FIG. 17 is a flowchart showing the operations of the NAND flash memory 100 at the time of the data write operation. FIG. 18 is a timing chart of commands and various signals transmitted from the controller 200 to the NAND flash memory 100. Note that in FIG. 17, the operations of the NAND flash memory 100 are executed under, for example, control of the sequencer 170.

As shown in FIGS. 17 and 18, before receiving the write command from the controller 200, in the NAND flash memory 100, the CG drivers 60 apply VSS to the signal lines CG. The block decoders 40 of the row decoders 120-0 to 120-3 set the signal lines BLK_SEL0 to BLK_SEL3 at the "L" level (e.g. VSS). Accordingly, the transistors 50 are in the off state, and the word lines WL of the blocks BLK0 to BLK3 are in the electrically floating state. At time t0, the NAND flash memory 100 receives the write command from the controller 200 (step S30). the write command includes, for example, the following command sequence: <80h><ADD><ADD><ADD><ADD><ADD><DAT> <DAT> . . . <10h>

That is, an address input is declared by a command "80h," and an address ADD is inputted over five cycles. By this address ADD, a block BLK and a page for data DAT to be written in are designated. Subsequently, write data DAT is inputted. Then, upon reception of a command "10h", the sequencer 170 initiates writing data to memory cells and the NAND flash memory 100 becomes in the busy state (step S31, time t0).

The write operations according to this embodiment generally include the following three operations:
Program operations
Discharge operations
Program verify operations The program operations are for injecting electrons into the charge accumulation layer of memory cells and raising the thresholds of the memory cells by applying program voltages VPGM to a selected word line WL. The operation of program-verifying is for determining whether or not the thresholds of the memory cells rise up to appropriate values. The discharge operations are for discharging the word lines WL by applying, for example, the voltage VSS to the word lines WL, as described in the fifth embodiment. By repetition of a set of these three operations, data is written in the memory cells.

The sequencer 170 firstly executes an operation of programming (step S32). That is, the block decoders 40 of the row decoders 120, according to the block address, set the signal BLK_SELi corresponding to the selected block BLK at the "H" level (VPGMH) (time t1). The example of FIG. 18 shows a case where the block BLK0 is selected. Then, the driver circuit 60 transfers voltage VPGM to a selected word line WL in the selected block BLK0, and voltage VPASS to unselected word lines WL. Voltage VPASS is a voltage to turn a memory cell on regardless of held data, and the voltages are set in the relation of VPGM>VPASS>VREAD. The operation of programming is performed by applying a voltage according to the write data to a bit line BL (time t1 to t2). During the operation of programming, in the row decoders 120-1 to 120-3 corresponding to the unselected blocks BLK1 to BLK3, the transistors 50 are turned off, and the word lines WL corresponding to the unselected blocks BLK1 to BLK3 are in the electrically floating state.

The sequencer 170 executes an operation of discharging next (step S33). That is, when the operation of programming ends (time t2), the CG drivers 60-0 to 60-7 transfer voltage VSS. In this state, the block decoders 40 of the row decoders 120 corresponding to all the blocks BLK assert the signals BLK_SEL0 to BLK_SEL3 (VBGST). Note that when transitioning from the operation of programming to the operation of discharging, the signal BLK_SEL0 corresponding to the selected block BLK0 remains in the asserted state while the potential of the signal BLK_SEL0 declines, for example, from VPGMH to VGBST. Consequently, the transistors 50 of all the row decoders 120-0 to 120-3 are turned on, and VSS is applied to all the word lines WL of all the blocks BLK to execute the operation of discharging (times t2 to t3).

The sequencer 170 executes an operation of program-verifying next (step S34, times t3 to t4). The operation of program-verifying is as the data read operations described in the above first to fifth embodiments. A difference lies in that a program-verify voltage Vvfy is applied to the selected word line WL. When the operation of program-verifying is initiated, in the row decoders 120-1 to 120-3 corresponding to the unselected blocks BLK1 to BLK3, the transistors 50 are in the "off" state, and the word lines WL corresponding to the unselected blocks BLK1 to BLK3 are in the electrically floating state.

If the program-verifying is passed after step S34 (step S35, YES), that is, if the thresholds of the targeted memory cells rise up to a value according to the write data, it is determined that the data write operation succeeds, and the data write operation ends. Then the NAND flash memory 100 returns to the ready state (step S36, time t9).

If the program-verifying fails (step S35, NO), the number of times of programming reaches a predetermined number of times (maximum times of repetition) (step S37, YES), the data write operation ends indicating a failure and proceeds with step S36. If the number of times of programming does not reach the predetermined number of times (step S37, NO), the CG driver 60 corresponding to the selected word line WL steps up voltage VPGM by ΔVPGM (step S38), and then, the processes in steps S32 to S35 are repeated.

6.2 Effects According to this Embodiment

According to this embodiment, effects similar to those of the above fifth embodiment can also be obtained. That is, according to this embodiment, during the data write operation, periods for selecting the unselected blocks BLK is provided in addition to the case of the selected block BLK. Then, during those periods, VSS is applied to the word lines WL of the unselected blocks BLK. Thus, the word lines WL are discharged every time the operation of programming operation is repeated, and the threshold variation of memory cells can be prevented.

Note that blocks subject to discharging are not limited to all the blocks BLK, but may be any of the blocks BLK. Alternatively, not only all the word lines WL, but also a part of the word lines WL may be selected. Furthermore, the example of FIG. 18 shows a case where the operation of discharging is conducted between the operation of programming and the operation of program-verifying. However, the operation of discharging may be conducted at any timing during the data write operation if the CG drivers 60 can transfer voltage VSS for the discharging. In addition, the frequency of conducting the operation of discharging can be selected as desired. That is, the operation of discharging may be conducted every time the operation of programming is conducted, or every time multiple operations of programming are conducted.

7. Modifications

As described above, memory systems according to the above embodiments include a semiconductor memory capable of holding data, and a controller capable of reading data from a semiconductor memory. The semiconductor memory includes a first block (e.g. BLK0 in FIG. 6) including a plurality of first memory cells three-dimensionally stacked above a semiconductor substrate, a plurality of first word lines (e.g. WL0-7 in FIG. 4) coupled to the first memory cells, a first row decoder (e.g. 120 in FIG. 4), and a driver circuit (e.g. 130 in FIG. 4) transferring voltages to first signal lines (e.g. CG0 to CG7 in FIG. 4). The first row decoder includes a plurality of first transistors (e.g. 50-0 to 50-7 in FIG. 4) capable of coupling the plurality of first word lines to the plurality of first signal lines (e.g. CG0 to CG7 in FIG. 4), and a first block decoder (e.g. 40 in FIG. 4) supplying a first block selection signal (e.g. BLK_SEL0 in FIG. 4) to gates of the plurality of first transistors. When the controller issues a read command (e.g. ReadCMD in FIG. 6) for reading data held in selected ones the first memory cells of the first block (e.g. BLK0) to the semiconductor memory (e.g. t0 in FIG. 6), the semiconductor memory outputs a busy signal (e.g. "Busy" in FIG. 6) notifying the controller that the semiconductor memory is in the busy state, and while the semiconductor memory is in the busy state, the first block decoder (e.g. 40 in FIG. 4) asserts the first block selection signal (e.g. BLK_SEL0=VGBST in FIG. 6) to turn on the first transistors (e.g. 50 in FIG. 4) to transfer a first voltage (e.g. VCGRV in FIG. 6) to selected one of the first word lines (e.g. WL0-7 in FIG. 4), and a second voltage (e.g. VREAD in FIG. 6) higher than the first voltage (e.g. VCGRV) to unselected other first word lines. Even after the data is read from the first block (BLK0) and a ready signal notifying the controller that the semiconductor memory is in the ready state is output (e.g. t2-t3 in FIG. 6), the first block decoder (e.g. 40 in FIG. 4) continues asserting the first block selection signal (e.g. BLK_SEL0 in FIG. 6) until a first period lapses (e.g. Δt in FIG. 6), and the driver circuit (e.g. 130 in FIG. 4) transfers a third voltage (e.g. VSS in FIG. 6) smaller than the first voltage (e.g. VCGRV in FIG. 6) to the first signal lines (e.g. CG0 to CG7 in FIG. 4). Then, when the first period (Δt) passes, the first block decoder negates the first block selection signal.

Alternatively, the semiconductor memory further includes a second block (e.g. BLK1 in FIG. 10) which includes a plurality of second memory cells three-dimensionally stacked above a semiconductor substrate, a plurality of second word lines (e.g. WL0-7 of BLK1) coupled to the second memory cells, and a second row decoder (e.g. 120-1 in FIG. 4) including a plurality of second transistors (e.g. 50-0 to 50-7 for BLK1) capable of coupling the plurality of second word lines to the plurality of first signal lines (e.g. CG0 to CG7), respectively, and a second block decoder (e.g. 40) supplying a second block selection signal (BLK_SEL0) to gates of the plurality of second transistors. When the controller issues another access command (e.g. ReadCMD in FIG. 10) to the second block (e.g. BLK1) for the semiconductor memory during the first period (e.g. Δt) (e.g. t4 in FIG. 10), the first block decoder (e.g. 40 in 120-0) negates the first block selection signal (e.g. BLK_SEL0 in FIG. 10), the second block decoder (e.g. 40 in 120-1) asserts the second block selection signal (e.g. BLK_SEL1 in FIG. 10), and the second transistor (e.g. 50 in 120-1) may initiate a transfer to the second word line (e.g. WL of BLK1) (t4 in FIG. 10).

Furthermore, when the controller issues a first command (e.g. XXh in FIG. 11) to the semiconductor memory (e.g. t4 in FIG. 11), the first block decoder (e.g. 40 in 120-0) and the second block decoder (e.g. 40 in 120-1) assert the first block selection signal (e.g. BLK_SEL0 in FIG. 10) and the second block selection signal (e.g. BLK_SEL1 in FIG. 10), respectively, and the first and second transistors (e.g. 50 in 120-1 and 120-2) may transfer a third voltage (e.g. VSS) to the first and second word lines (e.g. WL of BLK1 and BLK2) (t5 in FIG. 11).

In addition, when the controller issues a read command or a write command targeted at the first block (e.g. BLK0) to the semiconductor memory (e.g. t0 in FIGS. 16 and 18), during the data read operation or the data write operation in the semiconductor memory, the first and second row decoders concurrently transfer a first voltage (e.g. VSS in FIGS. 16 and 18) to the first and second word lines, respectively.

By this configuration, even if the potential of the word lines WL sharply decreases from a high voltage (e.g. VREAD) to a low voltage (e.g. VSS) immediately after data reading, it is possible to avoid the rise of the potential of the word lines WL in the floating state caused by coupling with the channel. Thereby, the occurrence of incorrect data reading is prevented, and the reliability of the operation of the memory system can be improved.

Figure 19:
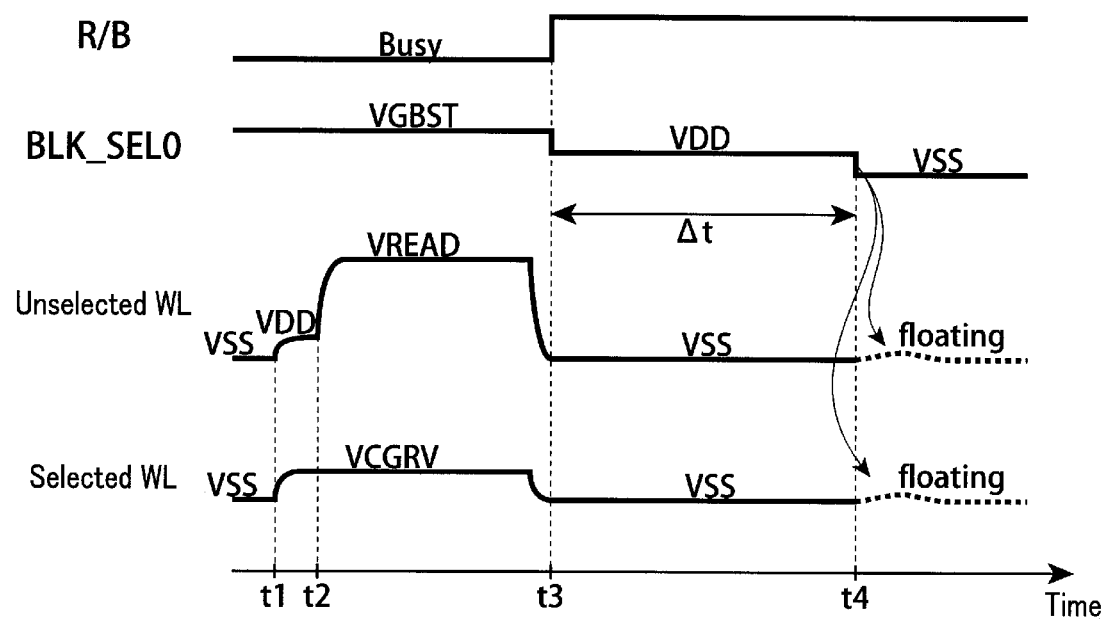
FIG. 19 illustrates a timing chart of various signals at the time of a data read operation according to a modification of the first to sixth embodiments.

The above described embodiment is only an example, and can be variously modified. FIG. 19 is a timing chart of various signals according to a modification of the first embodiment. FIG. 20 is a timing chart of a command sequence and various signals according to a modification of the second and third embodiments. As shown in the figures, the potential of the signal BLK_SELi when discharging the word lines WL may be a voltage lower than VGBST, and for example, VDD (VREAD>VDD>VSS). That is, to transfer VREAD to the word lines WL, it is necessary to apply VGBST that makes the gate potential of the transistor 50 of the row decoder 120 higher than VREAD by at least its threshold voltage; however, during the discharge period, the gate potential of the transistor 50 is sufficient if the transistor 50 can transfer VSS. Accordingly, by use of a voltage (VDD) lower than the high voltage VGBST, power consumption can be reduced. This is also applicable to the fourth to sixth embodiments.

Furthermore, in the above first and second embodiments, the period Δt for discharging the word lines WL may be different for each block BLK. That is, the sequencer 170 monitors the state of the blocks BLK and, for a certain block BLK with a large amount of voltage variation or electron trapping in the floating state, may set Δt to be longer than the other blocks BLK.

In addition, in FIG. 8, a case where each memory cell holds 3-bit data is described; such a case may be the case of holding, for example, data equal to or less than 2 bits, or data equal to or greater than 4 bits.

Note the following in each embodiment concerning the present invention:

(1) When the memory cell holds 2-bit data ("Er," "A," "B," and "C"), the voltage applied to the selected word line in the read operation of data at the "A" level may range from, for example, 0 V to 0.55 V. However, the present invention is not limited to this, and the voltage may be set within any one of the ranges of 0.1 V to 0.24 V, 0.21 V to 0.31 V, 0.31 V to 0.4 V, 0.4 V to 0.5 V, and 0.5 V to 0.55 V.

The voltage applied to the selected word line in the read operation of data at the "B" level may range from, for example, 1.5 V to 2.3 V. However, the voltage is not limited to this and may be set within any one of the ranges of 1.65 V to 1.8 V, 1.8 V to 1.95 V, 1.95 V to 2.1 V, and 2.1 V to 2.3 V.

The voltage applied to the selected word line in the read operation of data at the "C" level may range from, for example, 3.0 V to 4.0 V. However, the voltage is not limited to this and may be set within any one of the ranges of 3.0 V to 3.2 V, 3.2 V to 3.4 V, 3.4 V to 3.5 V, 3.5 V to 3.6 V, and 3.6 V to 4.0 V.

A time (tR) of the data read operation may be set within the range of, for example, 25 μs to 38 μs, 38 μs to 70 μs, or 70 μs to 80 μs (2) The data write operation may include an operation of programming and an operation of program-verifying. In the data write operation, the voltage first applied to the selected word line in the operation of programming may range from, for example, 13.7 V to 14.3 V. The voltage is not limited to it, and may be set within any one of the ranges of, for example, 13.7 V to 14.0 V and 14.0 V to 14.6 V.

The voltage first applied to the selected word line when write-accessing an odd-numbered word line and the voltage first applied to the selected word line when write-accessing an even-numbered word line may be different.

If the operation of programming may be ISPP (Incremental Step Pulse Program), the voltage of stepping-up may be, for example, 0.5 V.

The voltage applied to the unselected word lines may be set within the range of, for example, 6.0 V to 7.3 V. However, the voltage is not limited to it, and may be set within the range of, for example, 7.3 V to 8.4 or set to 6.0 V or less.

The pass voltage to be applied to the memory cells may be changed depending on whether the unselected word lines are an odd-numbered word line or an even-numbered word line.

A time (tProg) of the data write operation may be set within the range of, for example, 1,700 μs to 1,800 μs, 1,800 μs to 1,900 μs, or 1,900 μs to 2000 μs.

(3) In the data erase operation, the voltage first applied to the well that may be formed in the upper portion of the semiconductor substrate and above which the memory cells may be arranged may be set within the range of, for example, 12 V to 13.6 V. However, the voltage is not limited to it, and may be set within the range of, for example, 13.6 V to 14.8 V, 14.8 V to 19.0 V, 19.0 V to 19.8 V, or 19.8 V to 21 V.

A time (tErase) of the data erase operation may be set within the range of, for example, 3,000 μs to 4,000 μs, 4,000 μs to 5,000 μs, or 4,000 μs to 9,000 μs.

(4) The configuration of the memory cell

The charge accumulation layer may be arranged on the tunnel insulating film of 4 to 10 nm thick. The charge accumulation layer may be included in a stacked configuration of an insulating film of SiN or SiON of 2 to 3 nm thick and polysilicon of 3 to 8 nm thick. A metal such as ruthenium Ru may be added to the polysilicon. An insulating film is provided on the charge accumulation layer. The insulating film may include a silicon oxide film of 4 to 10 nm thick sandwiched between a lower High-k film of 3 to 10 nm thick and an upper High-k film of 3 to 10 nm thick. As the High-k film, HfO or the like maybe usable. The silicon oxide film maybe thicker than the High-k films. A control electrode of 30 to 70 nm thick may be formed on a work function adjusting material of 3 to 10 nm thick on the insulating film. Here, the work function adjusting material maybe a metal oxide film such as TaO or a metal nitride film such as TaN. As the control electrode, W or the like is usable.

An air gap may be formed between the memory cells.

In the above embodiments, a NAND flash memory has been exemplified as the semiconductor storage device. However, the embodiments may be applicable not only to the NAND flash memory but also to other general semiconductor memories, and also applicable to various kinds of storage devices other than the semiconductor memories. In the flowcharts described in the above embodiments, the order of processes may be changed as long as it is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a semiconductor memory capable of storing data; and
a controller capable of reading data from the semiconductor memory,
wherein the semiconductor memory includes:
a first block including a plurality of first memory cells three-dimensionally stacked above a semiconductor substrate;
a plurality of first word lines coupled to the first memory cells;
a first row decoder which includes a plurality of first transistors capable of coupling the plurality of first word lines to a plurality of first signal lines, and a first block decoder supplying a first block selection signal to gates of the plurality of first transistors; and
a driver circuit transferring voltages to the first signal lines, and
wherein when the controller issues a data read command for data held in the first block to the semiconductor memory,
the semiconductor memory outputs a busy signal notifying the controller that the semiconductor memory is in a busy state,
in the busy state, the first block decoder asserts the first block selection signal and turns on the first transistors to allow the first transistors to transfer a first voltage to a selected first word line, and a second voltage larger than the first voltage to unselected other first word lines, and
after data is read from the first block and the semiconductor memory outputs a ready signal notifying the controller that the semiconductor memory is in a ready state, the first block decoder continues asserting the first block selection signal until a lapse of a first period,
the driver circuit transfers a third voltage smaller than the first voltage to the first signal lines, and
when the first period passes, the first block decoder negates the first block selection signal.

2. The system according to claim 1, wherein the first row decoder transfers the third voltage to all the word lines included in the first block during the first period.

3. The system according to claim 1, wherein when the first voltage and the second voltage are transferred to the first word lines, a potential of the first block selection signal is set to a fourth voltage larger than the second voltage; and
when the third voltage is applied to the first word lines, a potential of the first block selection signal is set to a fifth voltage lower than the second voltage and higher than the third voltage.

4. The system according to claim 1, wherein the semiconductor memory further includes:
a second block including a plurality of second memory cells three-dimensionally stacked in an upper portion of the semiconductor substrate;
a plurality of second word lines coupled to the second memory cells; and
a second row decoder that includes a plurality of second transistors capable of coupling the plurality of second word lines to the plurality of first signal lines, and a second block decoder supplying a second block selection signal to gates of the plurality of second transistors, and
wherein when the controller issues an access command for the second block to the semiconductor memory during the first period,
the first block decoder negates the first block selection signal, and
the second block decoder asserts the second block selection signal.

5. The system according to claim 4, wherein upon the negation of the first block selection signal, the first word lines are set in an electrically floating state.

6. The system according to claim 4, wherein when the controller issues a first command to the semiconductor memory,
the first block decoder and the second block decoder assert the first block selection signal and the second block selection signal, respectively, to allow the first transistors and the second transistors to transfer the third voltage to the first word lines and the second word lines.

7. The system according to claim 1, wherein the first period is equal to or longer than a period during which a potential of the unselected other first word lines is the second voltage.

* * * * *